US012757764B2

(12) United States Patent
Liu et al.

(10) Patent No.: US 12,757,764 B2
(45) Date of Patent: Oct. 6, 2026

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Tzuan-Horng Liu, Taoyuan City (TW); Hao-Yi Tsai, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 594 days.

(21) Appl. No.: 18/343,757

(22) Filed: Jun. 29, 2023

(65) Prior Publication Data

US 2025/0006644 A1 Jan. 2, 2025

(51) Int. Cl.

| | |
|---|---|
| ***H10W 70/65*** | (2026.01) |
| ***H10W 70/60*** | (2026.01) |
| ***H10W 70/685*** | (2026.01) |
| ***H10W 90/00*** | (2026.01) |
| *H10W 72/90* | (2026.01) |
| *H10W 80/00* | (2026.01) |

(52) U.S. Cl.

CPC .......... *H10W 70/65* (2026.01); *H10W 70/611* (2026.01); *H10W 70/685* (2026.01); *H10W 90/00* (2026.01); *H10W 90/701* (2026.01); *H10W 72/923* (2026.01); *H10W 72/926* (2026.01); *H10W 72/934* (2026.01); *H10W 72/952* (2026.01); *H10W 72/953* (2026.01); *H10W 80/312* (2026.01); *H10W 80/327* (2026.01); *H10W 80/721* (2026.01); *H10W 90/794* (2026.01)

(58) Field of Classification Search

CPC . H01L 23/5381; H10W 70/65; H10W 70/611; H10W 70/685; H10W 90/00; H10W 90/701; H10W 72/923; H10W 72/926; H10W 72/934; H10W 72/952; H10W 72/953; H10W 80/312; H10W 80/327; H10W 80/721; H10W 90/794; H10W 70/614; H10W 90/401

See application file for complete search history.

(56) References Cited

U.S. PATENT DOCUMENTS

| | | | |
|---|---|---|---|
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |

(Continued)

*Primary Examiner* — Evan G Clinton
(74) *Attorney, Agent, or Firm* — JCIPRNET

(57) ABSTRACT

A semiconductor package and a manufacturing method thereof are provided. The semiconductor package includes a first device die and a second device die; an encapsulant, laterally encapsulating the first and second device dies; a bridge die, electrically connected to the first and second device dies and establishing communication between the first and second device dies; and bonding layers, between the first and second device dies and the bridge die, and including a first die bonding layer and a second die bonding layer respectively disposed upon the first device die and the second device die, and a third die bonding layer disposed upon the bridge die. Each of the bonding layers includes a polymer layer and metallic features embedded in the polymer layer.

20 Claims, 23 Drawing Sheets

(56) References Cited

U.S. PATENT DOCUMENTS

| | | | | |
|---|---|---|---|---|
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 2019/0139925 | A1* | 5/2019 | Yu | H01L 25/0652 |
| 2021/0202389 | A1* | 7/2021 | Hsieh | H01L 23/5386 |
| 2025/0015002 | A1* | 1/2025 | Kurita | H01L 23/5381 |

* cited by examiner

SEMICONDUCTOR PACKAGE AND MANUFACTURING METHOD THEREOF

BACKGROUND

Fan-out semiconductor packages are comprehensively utilized in advanced semiconductor products. In general, the fan-out semiconductor package is featured in using a redistribution layer for routing encapsulated device dies at a first side of the redistribution layer to a second side of the redistribution layer. However, the usage of redistribution layer adds much more complexity to packaging process, thus results in higher manufacturing cost. A more innovative semiconductor package with a cost effective yet reliable solution for routing the encapsulated device dies is thereby required for semiconductor packaging techniques of next generation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
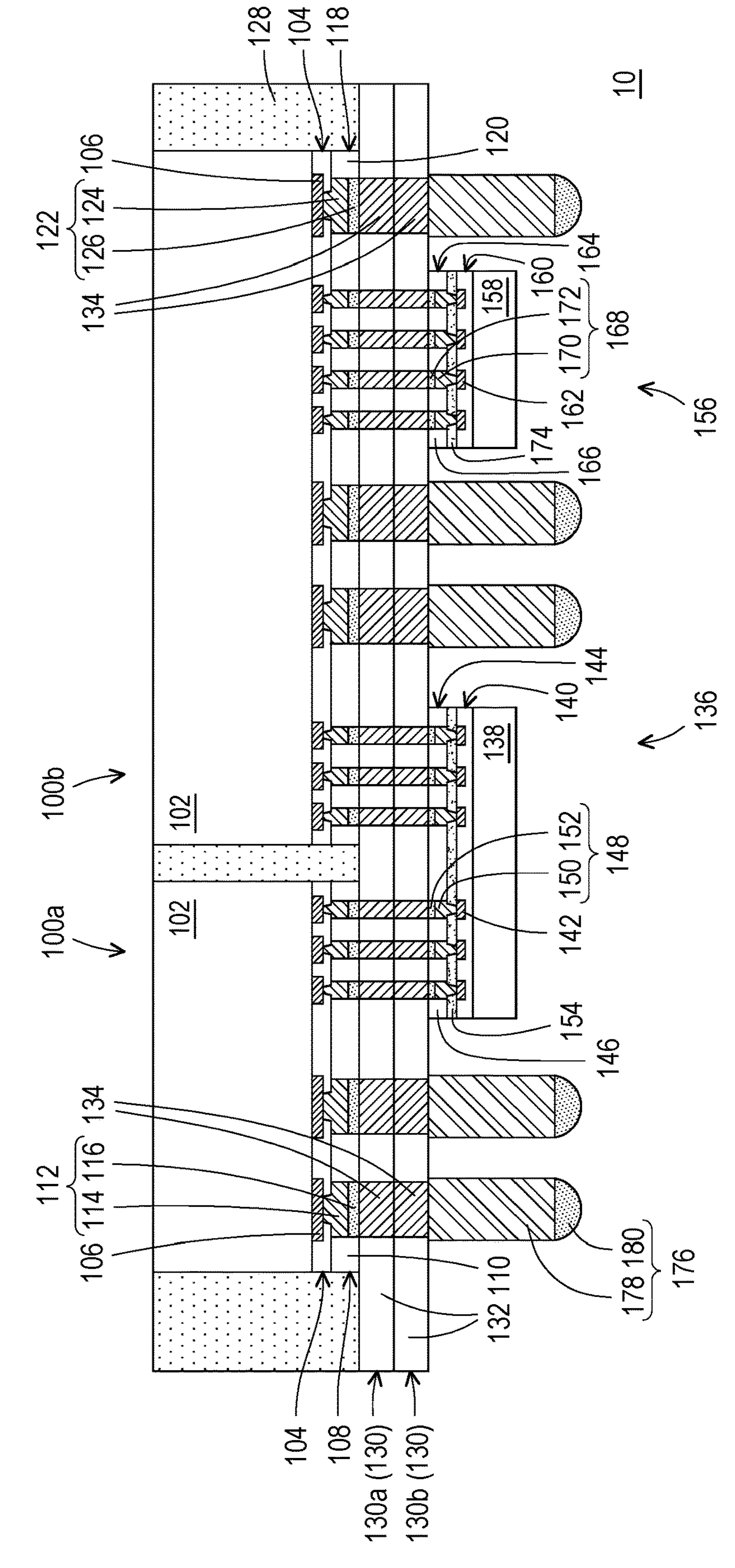
FIG. 1 is a schematic cross-sectional view illustrating a semiconductor package, according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional view illustrating a semiconductor package 10, according to some embodiments of the present disclosure.

Referring to FIG. 1, the semiconductor package 10 includes device dies 100*a*, 100*b* arranged side-by-side and are laterally spaced apart from each other. The device dies 100*a*, 100*b* may each include an integrated circuit having interconnected active devices, and may be referred to as active dies. In some embodiments, the device dies 100*a*, 100*b* are respectively a device die with system-on-chip (SoC) design, and may be different from each other in terms of footprint area. However, the device dies 100*a*, 100*b* may respectively be designed with any possible function, and may be identical with or different from each other in terms of function and/or footprint area.

The device dies 100*a*, 100*b* may respectively include a semiconductor substrate 102. A side of the semiconductor substrate 102 on which active devices (not shown) are built is referred to as an active side, while another side of the semiconductor substrate 102 opposite to the active side is referred to as a back side. In each of the device dies 100*a*, 100*b*, metallization layers 104 (only an outermost one is shown) are stacked on the active side of the semiconductor substrate 102, and conductive features in the metallization layers 104 are configured to interconnect the active devices and rout the active devices to external components. Conductive pads 106 in the depicted outermost metallization layers 104 may be functioned as input/output (I/O) terminals for the device dies 100*a*, 100*b*. According to some embodiments, a first group of the conductive pads 106 in each of the device dies 100*a*, 100*b* may be formed with a first pitch and a first pattern width, while a second group of the conductive pads 106 in each of the device dies 100*a*, 100*b* may be formed with a second pitch and a second pattern width greater than the first pitch and the first pattern width, respectively. In these embodiments, the conductive pads 106 in the first group may be (at least in part) configured to establish conduction paths bridging the device dies 100*a*, 100*b*, and the conductive pads 106 in the second group may be (at least in part) configured to receive power and ground signals.

An active side of the device die 100*a*, at which the conductive pads 106 of the device die 100*a* are revealed, is covered by a die bonding layer 108. The die bonding layer 108 may include a polymer layer 110 covering the outermost metallization layer 104 of the device die 100*a*, and contact features 112 filled in openings of the polymer layer 110 and electrically connected to the conductive pads 106 as the I/O terminals of the device die 100*a*. The polymer layer 110 may be patterned during singulation of the device die 100*a*, and sidewalls of the polymer layer 110 may be substantially coplanar with sidewalls of the metallization layers 104 and the semiconductor substrate 102 of the device die 100*a*. In some embodiments, the contact features 112 include contact metals 114 establishing contact with the conductive pads 106 of the device die 100*a*, and include solder caps 116 covering the contact metals 114. In addition to the contact metals 114, the solder caps 116 are confined in the openings of the polymer layer 110. Accordingly, solder caps 116 may not further laterally protrude with respect to the contact metals 114 in a possible thermal treatment during manufacturing. In some embodiments, sidewalls of the solder caps 116 are substantially aligned with sidewalls of the contact metals 114.

In those embodiments where different groups of the conductive pads 106 in the device die 100*a* are formed with different pattern widths and different pitches, the contact features 112 may be formed as having groups with different pattern widths and pitches as well. In the example that the first group of the conductive pads 106 in the device die 100*a* are formed with the first pitch and the first pattern width while the second group of the conductive pads 106 in the device die 100*a* are formed with the second pitch and the second pattern width (greater than the first pitch and the first pattern width, respectively), the contact features 112 in contact with the conductive pads 106 in the first group may be formed with a pitch and a pattern width close to (i.e., slightly less than or greater than) or equal with the first pitch and the first pattern width, respectively. In addition, the contact features 112 in contact with the conductive pads 106 in the second group may be formed with a pitch and a pattern width close to or equal with the second pitch and the second pattern width, respectively. As the solder caps 116 of the contact features 112 are confined by the polymer layer 108 (from laterally protruding), unintended contact between the solder caps 116 of adjacent contact features 112 can be effectively avoided, especially for the contact features 112 with relatively short pitch.

The polymer layer 108 is formed of a polymer material. For instance, the polymer layer 108 may be formed of polyimide, polybenzoxazole (PBO), the like or combinations thereof. In addition, the contact metal 114 may be formed of a single layer of metal or metal alloy, such as copper. Alternatively, the contact metal 114 may be a multilayer structure including a combination of metal/metal alloy layers. As a first example, the contact metal 114 may include a stack of a copper layer and a nickel layer, in which the copper layer is in contact with the corresponding conductive pad 106 and the nickel layer is in contact with the corresponding solder cap 116. As a second example, the contact metal 114 may include two copper layers and a nickel layer sandwiched between the copper layers. As a third example, the contact metal 114 may include a stack of a copper layer and a layer of cobalt-ferrum alloy, in which the copper layer is in contact with the corresponding conductive pad 106 and the layer of cobalt-ferrum alloy is in contact with the corresponding solder cap 116. Further, the solder cap 116 is formed of a solder material, such as a lead-free solder material or the like.

As similar to the device die 100*a*, the device die 100*b* is covered by a die bonding layer, referred to as a die bonding layer 118. The die bonding layer 118 lines along an active side of the device die 100*b*, at which the conductive pads 106 of the device die 100*b* are revealed. As similar to the die bonding layer 108 covering the device die 100*a*, the die bonding layer 118 includes a polymer layer (referred to as a polymer layer 120) and contact features (referred to as contact features 122) embedded therein. In addition, the contact features 122 may respectively include a contact metal 124 and a solder cap 126 covering the contact metal 124. The polymer layer 120 may have sidewalls substantially aligned with sidewalls of the device die 100*b* (i.e., sidewalls of the semiconductor substrate 102 and the metallization layers 104 in the device die 100*b*). The contact features 122 including the contact metals 124 and the solder caps 126 are confined in openings of the polymer layer 120, and are formed as having groups with different pitches and pattern widths, such that a pitch and a pattern width of the contact features 122 in each group are close to or equal with the pitch and the pattern width of the overlapping conductive pads 106. Since the contact features 122 are confined by the polymer layer 120, unintended contact of the solder caps 126 of adjacent contact features 122 (even the ones with short pitch) can be effectively avoided. Further, the described material alternatives for the polymer layer 110, the contact metals 114 and the solder caps 116 may be applied to the polymer layer 120, the contact metals 124 and the solder caps 126. Even though, material selection of the polymer layer 120, the contact metals 124 and the solder caps 126 may be identical or different (at least in part) from material selection of the polymer layer 110, the contact metals 114 and the solder caps 116.

An encapsulant 128 laterally encapsulates the device dies 100*a*, 100*b* and the die bonding layers 108, 118 covering the device dies 100*a*, 100*b*. According to some embodiments, a surface of the encapsulant 128 is substantially coplanar with a surface of the die bonding layer 108 at which the solder caps 116 are revealed, and substantially coplanar with a surface of the die bonding layer 118 at which the solder caps 126 are revealed. As an example, the encapsulant 128 may include a molding compound and fillers spreading in the molding compound to improve mechanical strength and/or thermal conductance of the encapsulant 128.

Moreover, the semiconductor package 10 further includes package bonding layers 130 bonded with the die bonding layers 108, 118. According to some embodiments, two package bonding layers 130 (referred to as package bonding layers 130*a*, 130*b*) are stacked on the encapsulated structure including the encapsulant 128 and the surrounded device dies 100*a*, 100*b* and die bonding layers 108, 118. The package bonding layer 130*a* is in contact with the encapsulated structure, and the package bonding layer 130*b* is separated from the encapsulated structure via the package bonding layer 130*a*. Each of the package bonding layers 130*a*, 130*b* includes a polymer layer 132 and contact metals 134 filled in openings extending through the polymer layer 132. The polymer layer 132 of the package bonding layer 130*a* covers the entire encapsulant 128 and is bonded with the polymer layers 110, 120 of the die bonding layers 108, 118, and the contact metals 134 of the package bonding layer 130*a* are bonded to the contact metals 114, 124 of the die bonding layers 108, 118 through the solder caps 116, 126 in between. On the other hand, the polymer layer 132 of the package bonding layer 130*b* covers the polymer layer 132 of the package bonding layer 130*a*, and the contact metals 134 of the package bonding layer 130*b* are in contact with the contact metals 134 of the package bonding layer 130*a*, respectively. As the polymer layers 132 of the package bonding layers 130*a*, 130*b* may be patterned during singulation of the encapsulated structure, sidewalls of the polymer layers 132 may be substantially coplanar with sidewalls of the encapsulant 128. In addition, the contact metals 134 of the package bonding layers 130*a*, 130*b* are positioned substantially in accordance with (i.e., in alignment with) the contact features 112, 122 of the die bonding layers 108, 118 such that sufficient contact area between the contact metals 134 of the package bonding layer 130*a* and the contact features 112, 122 of the die bonding layers 108, 118, and sufficient contact area between the contact metals 134 of the package bonding layer 130*a* and the contact metals 134 of the package bonding layers 130*b* can be ensured. Further, stacks of the contact metals 134 in the package bonding layers 130*a*. 130*b* can be grouped by pitch and pattern width, such that a pitch and a pattern width of the contact metals 134 in each group are close to or equal with the pitch and the pattern width of the overlapping contact features 112.

As similar to the polymers 110, 120 of the die bonding layers 108, 118, the polymer layers 132 of the package bonding layers 130*a*, 130*b* are each formed of a polymer material, such as polyimide, polybenzoxazole (PBO), the like or combinations thereof. In some embodiments, the polymer layers 132 of the package bonding layers 130*a*, 130*b* are formed of the same polymer material. In alternative embodiments, the polymer layers 132 of the package bonding layers 130*a*, 130*b* are formed of different polymer materials. In addition, as similar to the contact metals 114, 124 in the die bonding layers 108, 118, the contact metals 134 in the package bonding layers 130*a*, 130*b* may be respectively formed of a single layer of metal or metal alloy (e.g., copper), or respectively be a multilayer structure including a combination of metal/metal alloy layers (e.g., a stack of a copper layer and a nickel layer, a stack of two copper layers and a nickel layer sandwiched between the copper layer, or a stack of a copper layer and a layer of cobalt-ferrum alloy).

According to the described configuration, the conductive pads 106 as the I/O terminals of the device dies 100*a*, 100*b* can be routed to a first side of the package bonding layers 130 via the contact features 112, 122 in the die bonding layers 108, 118, and can be further routed to a second side of the package bonding layers 130 via the contact metals 134 in the package bonding layers 130. As compared to a redistribution layer that is configured to provide vertical and lateral conduction paths, the package bonding layers 130 may only provide vertical conduction paths by stacks of the contact metals 134. Owing to absence of lateral conduction paths in the package bonding layers 130, the contact metals 134 in the package bonding layers 130 may not be routed to a range wider than regions overlapped with the device dies 100*a*, 100*b*. Instead, the contact metals 134 are spread within the regions overlapped with the device dies 100*a*, 100*b*, and are connected to and in alignment with the contact features 112, 122 of the die bonding layers 108, 118 as well as the conductive pads 106 of the device dies 100*a*, 100*b*. Further, as fine conduction paths may be absent in the package bonding layers 130, the package bonding layers 130 can be formed with less complexity, and manufacturing cost can be lowered.

Since the package bonding layers 130 may not provide lateral routing for the device dies 100*a*, 100*b*, the device dies 100*a*, 100*b* may not be communicated with each other solely by conductive features in the package bonding layers 130. In some embodiments, a bridge die 136 may be attached to the package bonding layers 130 for realizing cross-talking between the device dies 100*a*, 100*b*. The bridge die 136 may be overlapped with both of the device dies 100*a*, 100*b*, and extend over a portion of the encapsulant 128 filled in a spacing between the device dies 100*a*, 100*b*. As similar to each of the device dies 100*a*, 100*b*, the bridge die 136 may include a semiconductor substrate (referred to as a semiconductor substrate 138), and metallization layers (referred to metallization layers 140, and only an outermost one is shown) stacked thereon. In some embodiments, the semiconductor substrate 138 is not formed with any active device, and the bridge die 136 can also be referred to as a passive die. In other embodiments, at least some active devices are formed on the semiconductor substrate 138, and the bridge die 136 may further have logic functions. Although not shown, conductive features in the metallization layers 140 may include laterally extending wirings required for bridging the device dies 100*a*, 100*b*. Conductive pads 142 in the depicted outermost metallization layer 140 may be functioned as I/O terminals of the bridge die 136, and are positioned in accordance with (i.e., in alignment with) the contact metals 134 in the package bonding layers 130, the contact features 112, 122 in the die bonding layers 108, 118 and the conductive pads 106 of the device dies 100*a*, 100*b* that are configured to transmit signals between the device dies 100*a*, 100*b*.

A die bonding layer 144 lies over the metallization layers 140, and is bonded with the package bonding layer 130*b* exposed at the second side of the package bonding layers 130 facing away from the encapsulated structure. A polymer layer 146 of the die bonding layer 144 is bonded with the polymer layer 132 of the package bonding layer 130*b*. As the polymer layer 146 may be patterned during singulation of the bridge die 136, sidewalls of the polymer layer 146 may be substantially coplanar with sidewalls of the metallization layers 140 and sidewalls of the semiconductor substrate 138 of the bridge die 136. In addition, contact features 148 filled in openings of the polymer layer 146 extend to the conductive pads 142 of the bridge die 136, and are bonded with some of the contact metals 134 in the package bonding layer 130*b* that are in alignment with the contact features 148 and the conductive pads 142 of the bridge die 136, so as to be connected to the overlapping conductive pads 106 of the device dies 100*a*, 100*b* through these contact metals 134. In this way, vertical conduction paths between the bridge die 136 and the device dies 100*a*, 100*b* can be established through the contact features 148 in the die bonding layer 144 and stacks of the metal contacts 134 in the package bonding layers 130, the contact features 112, 122 in the die bonding layers 108, 118 and the conductive pads 106 in the device dies 100*a*, 100*b* that are in alignment with the contact features 148 in the die bonding layer 144 and the conductive pads 142 of the bridge die 136. Further, these vertical conduction paths may be connected to lateral conduction paths (not shown) embedded in the metallization layers 104, and the device dies 100*a*, 100*b* can be bridged via these vertical and lateral conduction paths. In some embodiments, the conductive pads 106 connected to the bridge die 136 are formed with the first pitch and the first pattern width shorter than the second pitch and the second pattern width of another group of the conductive pads 106. In these embodiments, the contact features 112, 122 in the die bonding layer 108, 118, the contact metals 134 in the package bonding layers 130, the contact features 148 in the die bonding layer 144 and the conductive pads 142 of the bridge die 136 that are connected to and in alignment with these conductive pads 106 may be formed with a pitch and a pattern width close to or identical with the relatively short pitch and pattern width of these conductive pads 106.

According to some embodiments, each of the contact features 148 in the die bonding layer 144 includes a contact metal 150 establishing contact with the corresponding conductive pad 142, and includes a solder cap 152 covering the contact metal 150 and in contact with the corresponding contact metal 134 in the package bonding layer 130*b*. In addition to the contact metals 150, the solder caps 152 are confined in the polymer layer 146, thus may not further laterally protrude with respect to the contact metals 150 in a possible thermal treatment during manufacturing. Accordingly, despite being formed with a relatively short pitch, the solder caps 152 can be properly separated with one another, and unintended contact between adjacent solder caps 152 can be avoided. In some embodiments, sidewalls of the solder caps 152 are substantially coplanar with sidewalls of the contact metals 150. Further, the described material alternatives for the polymer layer 110, the contact metals 114 and the solder caps 116 of the die bonding layer 108 may be applied to the polymer layer 146, the contact metals 150 and the solder caps 152 of the die bonding layer 144. Even though, material selection of the polymer layer 146, the contact metals 150 and the solder caps 152 may be identical or different (at least in part) from material selection of the polymer layer 110, the contact metals 114 and the solder caps 116.

In some embodiments, a protection layer 154 is further inserted between the metallization layers 140 and the die bonding layer 144. In these embodiments, the contact metals 150 in the die bonding layer 144 may further extend through the protection layer 154, to reach the conductive pads 142 in the outermost metallization layer 140. In those embodiments where the polymer layer 146 of the die bonding layer 144 is patterned during singulation of the bridge die 136, the protection layer 154 may also be patterned during the singulation, such that sidewalls of the protection layer 154 may be substantially coplanar with the sidewalls of the metallization layers 140, the sidewalls of the semiconductor substrate 138 and the sidewalls of the polymer layer 146. In regarding material selection, the protection layer 154 may be formed of a polymer material, such as polyimide.

According to some embodiments, a passive die 156 is further attached to the package bonding layer 130*b* exposed at the second side of the package bonding layers 130 facing away from the encapsulated structure. The passive die 156 may be laterally spaced apart from the bridge die 136, and may be electrically connected to one of the device dies 100*a*, 100*b*, such as the device die 100*b*. As similar to the bridge die 136 and each of the device dies 100*a*. 100*b*, the passive die 156 may include a semiconductor substrate (referred to as a semiconductor substrate 158) and metallization layers (referred to metallization layers 160, and only an outermost one is shown) stacked thereon. Although not shown, passive devices/circuits may be embedded in the semiconductor substrate 158 and/or the stack of metallization layers 160. In addition, conductive pads 162 in the depicted outermost metallization layer 160 may be functioned as I/O terminals of the passive die 156, and are positioned in accordance with some conductive pads 106 of the one of the device dies 100*a*, 100*b* connected to the passive die 156 (e.g., the device die 100*b*).

A die bonding layer 164 lies over the metallization layers 160, and is bonded with the package bonding layer 130*b* exposed at the second side of the package bonding layers 130 facing away from the encapsulated structure. A polymer layer 166 of the die bonding layer 164 is bonded with the polymer layer 132 of the package bonding layer 130*b*. As the polymer layer 166 may be patterned during singulation of the passive die 156, sidewalls of the polymer layer 166 may be substantially coplanar with sidewalls of the metallization layers 160 and sidewalls of the semiconductor substrate 158 of the passive die 156. In addition, contact features 168 filled in openings of the polymer layer 166 extend to the conductive pads 162 of the passive die 156, and are bonded with some of the contact metals 134 in the package bonding layer 130*b* that are in alignment with the contact features 168 and the conductive pads 162 of the passive die 156. In the example that the passive die 156 is connected to the device die 100*b*, vertical conduction paths between the passive die 156 and the device die 100*b* can be established through the conductive pads 162 of the passive die 156, the contact features 168 in the die bonding layer 164 and stacks of the metal contacts 134 in the package bonding layers 130, the contact features 122 in the die bonding layers 118 and the conductive pads 106 in the device die 100*b* that are in alignment with the contact features 168 in the die bonding layer 164 and the conductive pads 162 of the passive die 156. In some embodiments, the conductive pads 106 connected to the passive die 156 are formed with the first pitch and the first pattern width shorter than the second pitch and the second pattern width of another group of the conductive pads 106. In the example that the passive die 156 is connected to the device die 100*b*, the contact features 122 in the die bonding layer 118, the contact metals 134 in the package bonding layers 130, the contact features 168 in the die bonding layer 164 and the conductive pads 162 of the passive die 156 that are connected to and in alignment with these conductive pads 106 may be formed with a pitch and a pattern width close to or identical with the relatively short pitch and pattern width of these conductive pads 106.

According to some embodiments, each of the contact features 168 in the die bonding layer 164 includes a contact metal 170 establishing contact with the corresponding conductive pad 162, and includes a solder cap 172 covering the contact metal 170 and in contact with the corresponding contact metal 134 in the package bonding layer 130*b*. In addition to the contact metals 170, the solder caps 172 are confined in the polymer layer 166, thus may not further laterally protrude with respect to the contact metals 170 in a possible thermal treatment during manufacturing. Accordingly, despite being formed with a relatively short pitch, the solder caps 172 can be properly separated with one another, and unintended contact between adjacent solder caps 172 can be avoided. In some embodiments, sidewalls of the solder caps 172 are substantially coplanar with sidewalls of the contact metals 170. Further, the described material alternatives for the polymer layer 110, the contact metals 114 and the solder caps 116 of the die bonding layer 108 may be applied to the polymer layer 166, the contact metals 170 and the solder caps 172 of the die bonding layer 164. Even though, material selection of the polymer layer 166, the contact metals 170 and the solder caps 172 may be identical or different (at least in part) from material selection of the polymer layer 110, the contact metals 114 and the solder caps 116.

In some embodiments, a protection layer 174 is further inserted between the metallization layers 160 and the die bonding layer 164. In these embodiments, the contact metals 170 in the die bonding layer 164 may further extend through the protection layer 174, to reach the conductive pads 162 in the outermost metallization layer 160 of the passive die 156. In those embodiments where the polymer layer 166 of the die bonding layer 164 is patterned during singulation of the passive die 156, the protection layer 174 may also be patterned during the singulation, such that sidewalls of the protection layer 174 may be substantially coplanar with the sidewalls of the metallization layers 160, the sidewalls of the semiconductor substrate 158 and the sidewalls of the polymer layer 166. In regarding material selection, the protection layer 174 may be formed of a polymer material, such as polyimide.

For providing signals including power and ground voltages to the device dies 100*a*, 100*b*, electrical connectors 176 may also be attached to the second side of the package bonding layers 130 facing away from the encapsulated structure. The electrical connectors 176 are electrically connected to the device dies 100*a*, 100*b* through vertical conduction paths each including a stack of the metal contacts 134 in the package bonding layers 130, the contact feature 112/122 in the die bonding layer 108/118 in contact with the stack of the metal contacts 134 and the conductive pad 106 of the device die 100*a*/100*b* in alignment with the stack of the metal contacts 134. These vertical conduction paths may be shorter in height as compared to those vertical conduction paths for connecting the device dies 102 to the bridge die 136 and the passive die 156. In some embodiments, the conductive pads 106 connected to the electrical connectors 176 are formed with the second pitch and the second pattern width greater than the first pitch and the first pattern width of other conductive pads 106 connected to the bridge die 136 (and the passive die 156). In these embodiments, a pitch and a pattern width of the contact features 112, 122 connected to the electrical connectors 176 are close to or identical with the second pitch and the second pattern width, respectively. Similarly, a pitch and a width of the stacks of the metal contacts 134 connected to the electrical connectors 176 are also close to or identical with the second pitch and the second pattern width, respectively. Further, the electrical connectors 176 may be formed with a pitch and a pattern width close to the second pitch and the second pattern width, respectively. According to some embodiments, the electrical connectors 176 are pillar bumps. In these embodiments, each of the electrical connectors 176 may include a conductive pillar 178 establishing contact with the corresponding contact metal 134 in the package bonding layer 130*b*, and include a solder cap 180 covering an end of the conductive pillar 178.

As described, the semiconductor package 10 uses bonding layers (including the die bonding layers 108, 118, 144 and the package bonding layers 130) to provide routing for the device dies 100*a*, 100*b*. Stacks of conductive features in these bonding layers form vertical conductive paths, for connecting the device dies 100*a*, 100*b* to the other side of the bonding layers. As compared to a redistribution layer with fine lateral conduction paths and vertical paths, the bonding layers only having the vertical conduction paths can be formed with less complexity and lower manufacturing cost. Further, the solder caps 116, 126 in the bonding layers are confined in polymer layers (i.e., the polymer layers 110, 120, 132), thus can be avoided from laterally protruding during a possible thermal treatment during manufacturing, and proper isolation between the vertical conduction paths in the bonding layers can be ensured.

Figure 2:
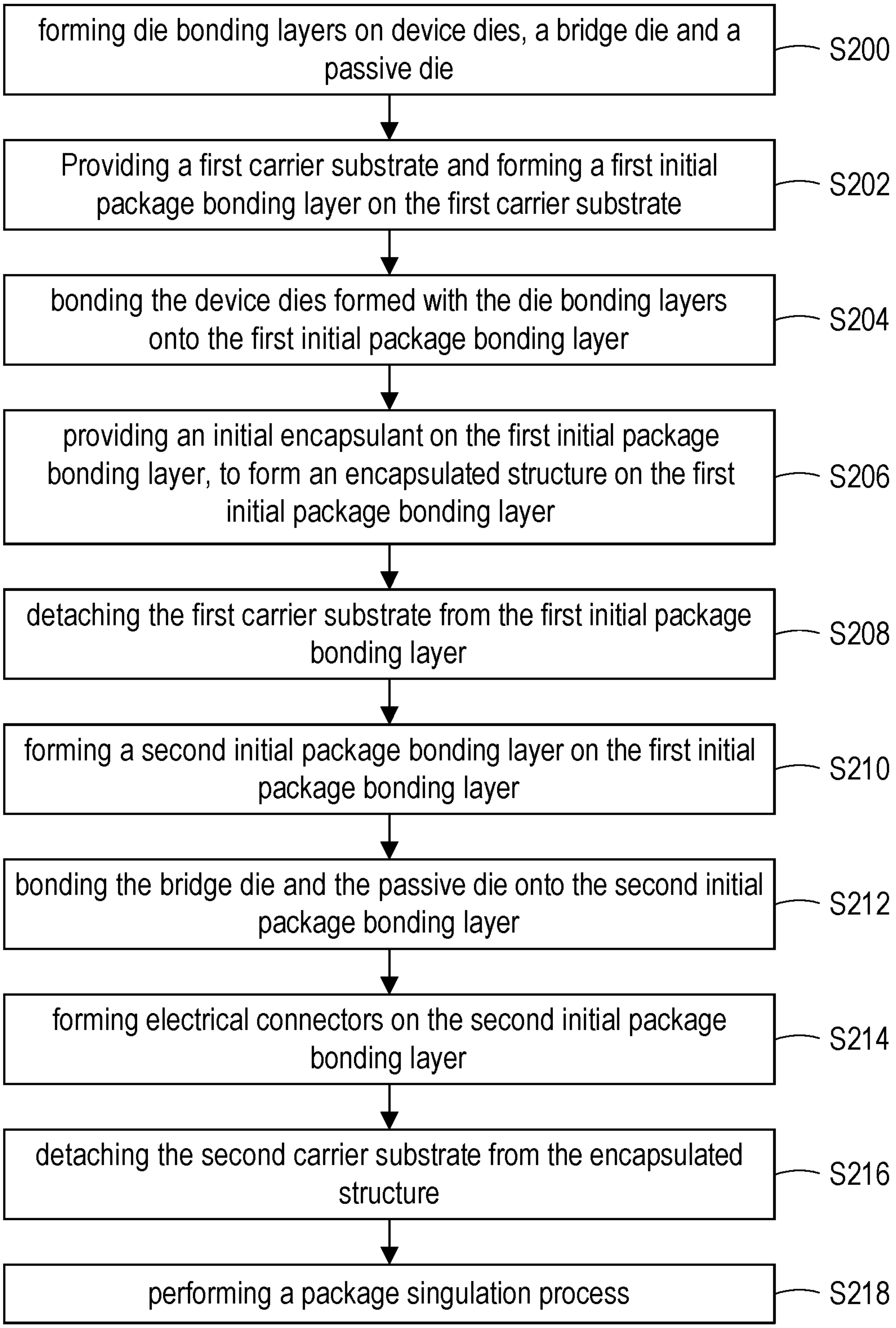
FIG. 2 is a flow diagram illustrating a method for manufacturing the semiconductor package shown in FIG. 1, according to some embodiments of the present disclosure.

FIG. 2 is a flow diagram illustrating a method for manufacturing the semiconductor package 10, according to some embodiments of the present disclosure. FIG. 3A through FIG. 3J are schematic cross-sectional views illustrating intermediate structures at various stages during the process illustrated in FIG. 2, according to some embodiments of the present disclosure.

Figure 3A:
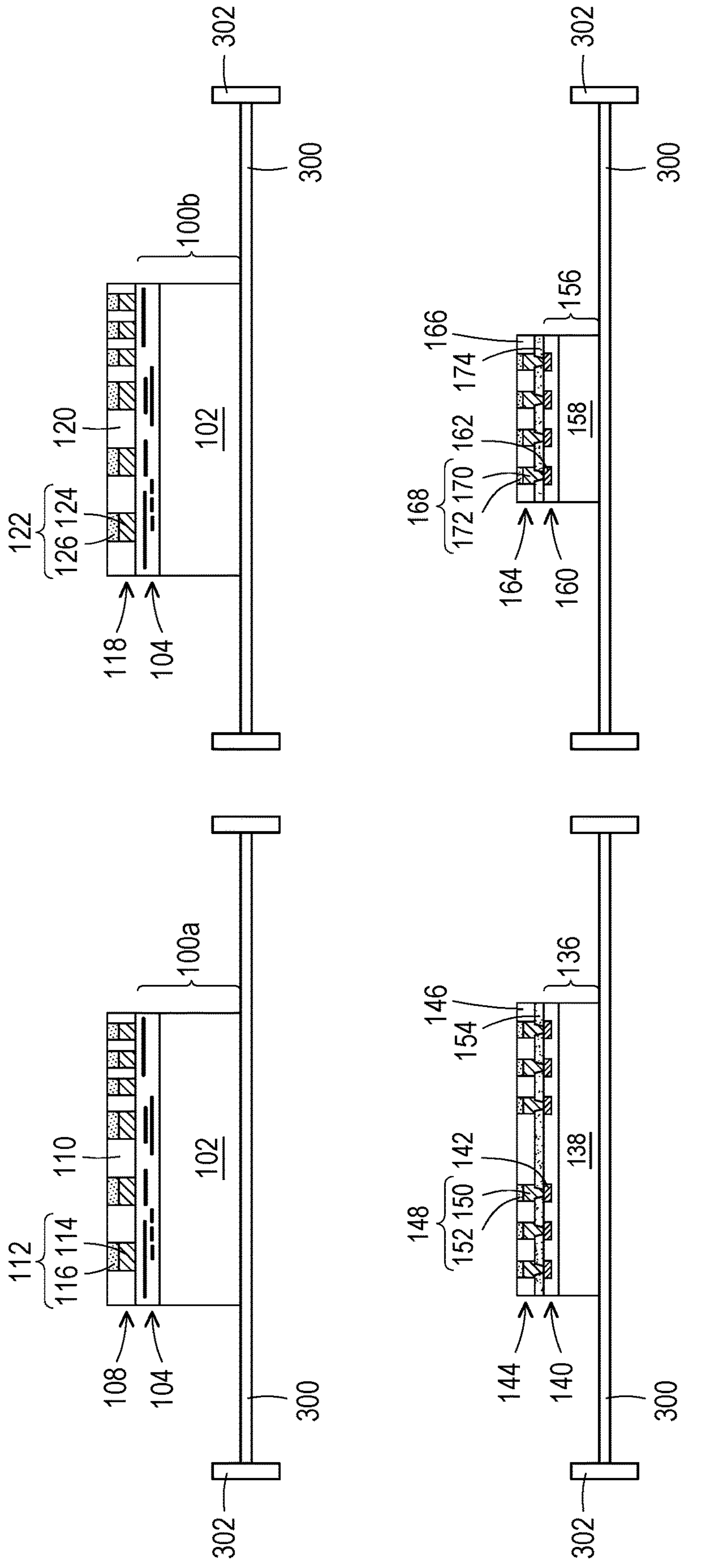
FIG. 3A through FIG. 3J are schematic cross-sectional views illustrating intermediate structures at various stages during the process illustrated in FIG. 2, according to some embodiments of the present disclosure.

Referring to FIG. 2 and FIG. 3A, at a step S200, die bonding layers 108, 118, 144, 164 are formed on the device dies 100*a*, 100*b*, the bridge die 136 and the passive die 156, respectively. Formation of the die bonding layer 108 on the device die 100*a* may include forming the contact metals 114 on the device die 100*a* (in wafer form), and providing the solder caps 116 on the contact metals 114. Further, a polymer material may be provided on the device die 100*a* and covers the contact metals 114 and the solder caps 116. Subsequently, a planarization process may be performed on the polymer material to expose the solder caps 116, and remained portions of the polymer material form an initial polymer layer surrounding the contact metals 114 and the solder caps 116. During singulation of the device die 100*a*, the initial polymer layer is patterned to form the polymer layer 110. According to some embodiments, the device die 100*a* is mounted onto a tape 300 held by a frame 302 during the singulation process.

In a similar way, the die bonding layer 118 is formed on the device die 100*b*; the die bonding layer 144 is formed on the bridge die 136; and the die bonding layer 164 is formed on the passive die 156. According to some embodiments, an initial protection layer is formed on the bridge die 136 before formation of the contact metals 150 and the solder caps 152, and is then patterned to form the protection layer 154 while the bridge die 136 is subjected to singulation. Similarly, in some embodiments, an initial protection layer is formed on the passive die 156 before formation of the contact metals 170 and the solder caps 172, and is then patterned to form the protection layer 174 while the passive die 156 is subjected to singulation.

Figure 3B:
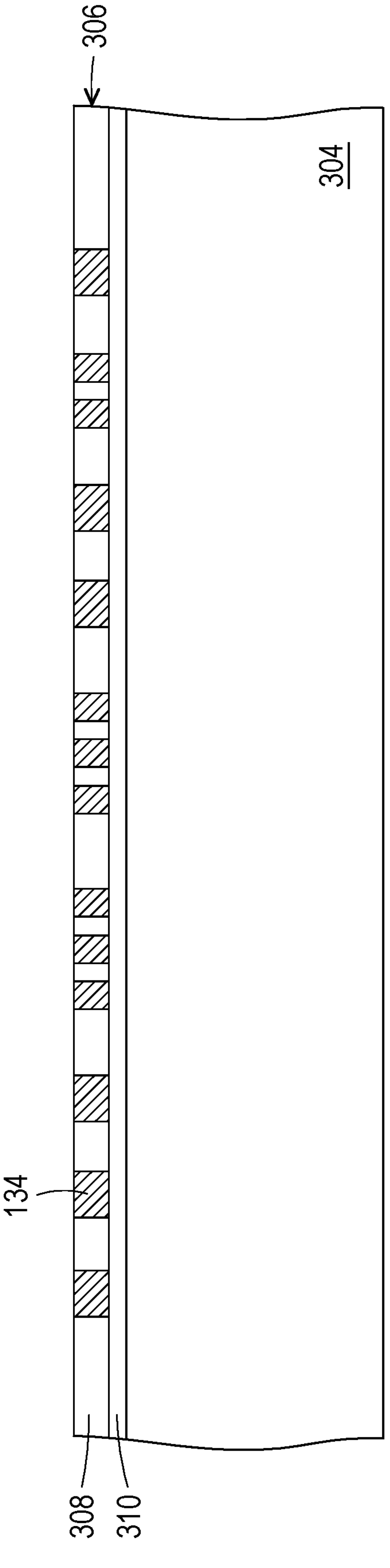

Referring to FIG. 2 and FIG. 3B, at a step S202, a carrier substrate 304 is provided and an initial package bonding layer 306 is formed on the carrier substrate 304. The initial package bonding layer 306 will be patterned to form the package bonding layer 130*b* as described with reference to FIG. 1. Specifically, the initial package bonding layer 306 includes the contact metals 134 of the package bonding layer 130*b*, and includes a polymer material layer 308 to be patterned to form the polymer layer 132 of the package bonding layer 130*b*. In some embodiments, the carrier substrate 304 is a glass carrier substrate. Further, in some embodiments, an adhesive layer 310 is provided on the carrier substrate 304 before formation of the initial package bonding layer 306. As an example, the adhesive layer 310 is a light-to-heat conversion (LTHC) coating layer.

Figure 3C:
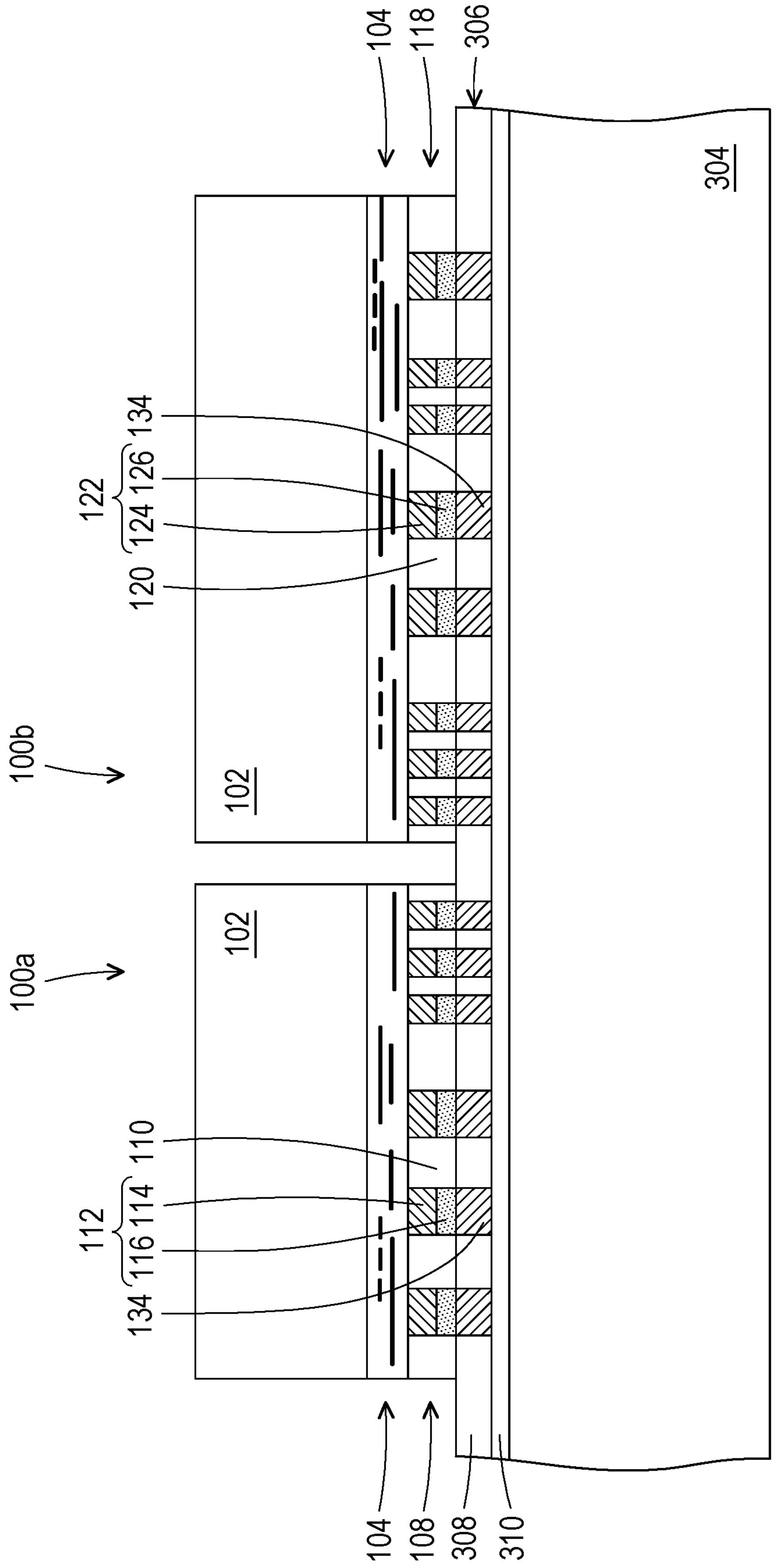

Referring to FIG. 2 and FIG. 3C, at a step S204, the device die 100*a* formed with the die bonding layer 108 as well as the device die 100*b* formed with the die bonding layer 118 are bonded onto the initial package bonding layer 306. Preliminarily, the device die 100*a* formed with the die bonding layer 108 is picked and placed on the initial package bonding layer 306, such that the solder caps 116 of the die bonding layer 108 are in contact with some contact metals 134 of the initial package bonding layer 306, and the contact metals 114 as well as the solder caps 116 in the die bonding layer 108 are in alignment with these contact metals 114 in the initial package bonding layer 306. Similarly, the device die 100*b* formed with the die bonding layer 118 is picked and placed aside the device die 100*a* on the initial package bonding layer 306, such that the solder caps 126 of the die bonding layer 118 are in contact with other contact metals 134 of the initial package bonding layer 306, and the contact metals 124 as well as the solder caps 126 in the die bonding layer 118 are in alignment with these contact metals 134 in the initial package bonding layer 306. Thereafter, a thermal treatment is performed. During the thermal treatment, the polymer layer 110 of the die bonding layer 108 covering the device die 100*a* and the polymer layer 120 of the die bonding layer 118 covering the device die 100*b* are bonded to the polymer material layer 308 of the initial package bonding layer 306. Further, the contact metals 114 in the die bonding layer 108 are bonded to the overlapping contact metals 134 in the initial package bonding layer 306 through the solder caps 116 in between, and the contact metals 124 in the die bonding layer 118 are bonded to the overlapping contact metals 134 in the initial package bonding layer 306 through the solder caps 126 in between. As described, since the solder caps 116, 126 are confined by the polymer layers 110, 120, further lateral protrusion of the solder caps 116, 126 at elevated temperature during the thermal treatment may be avoided. Therefore, unintended contact between adjacent solder caps 116, 126 can be effectively prevented.

Figure 3D:
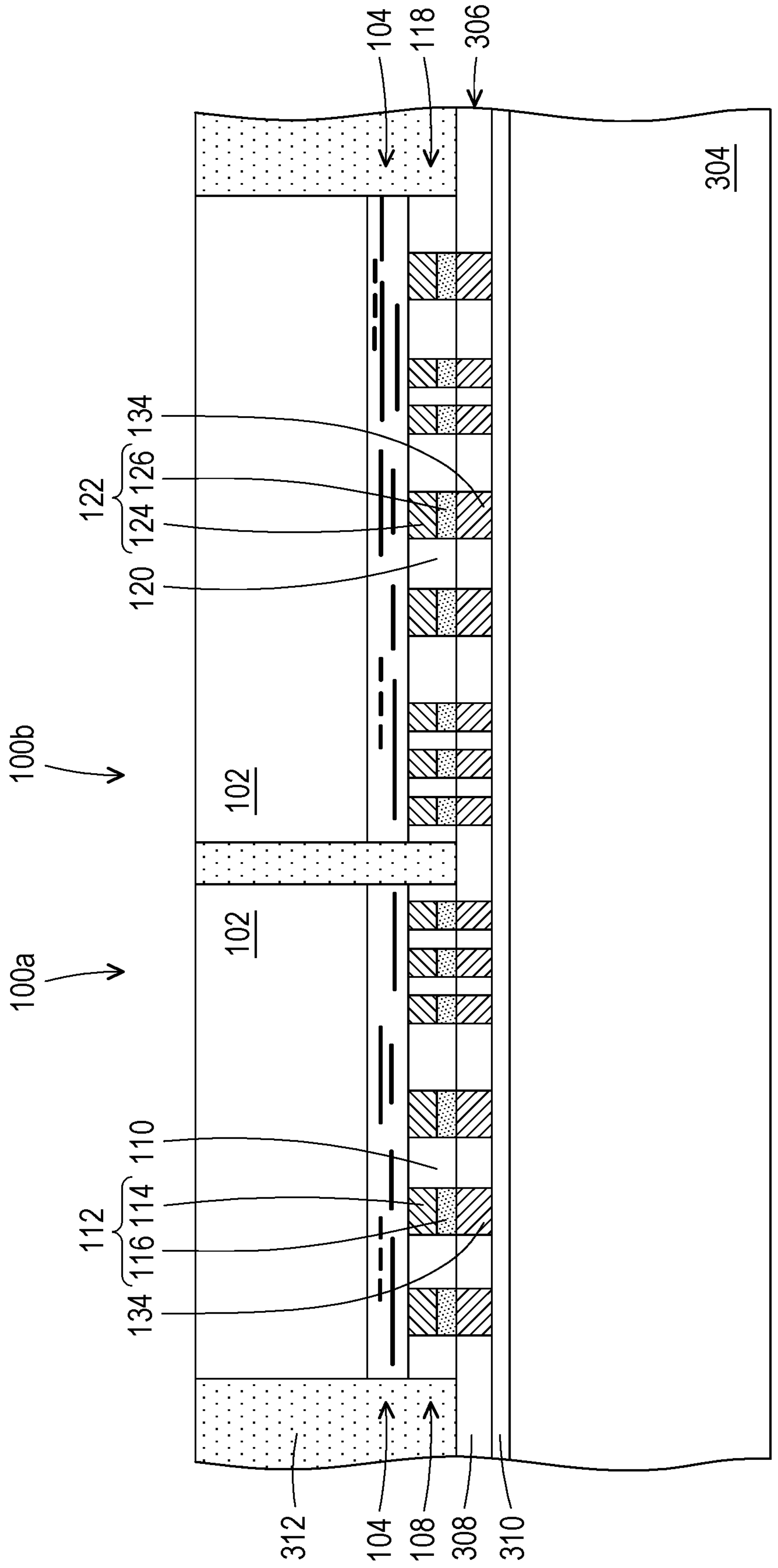

Referring to FIG. 2 and FIG. 3D, at a step S206, an initial encapsulant 312 is provided on the initial package bonding layer 306. As a result, the device die 100*a* coated with the die bonding layer 108 as well as the device die 100*b* coated with the die bonding layer 118 are laterally encapsulated by the initial encapsulant 312. In a subsequent step, the initial encapsulant 312 will be patterned to form the encapsulant 128 described with reference to FIG. 1 during a package singulation process.

Figure 3E:
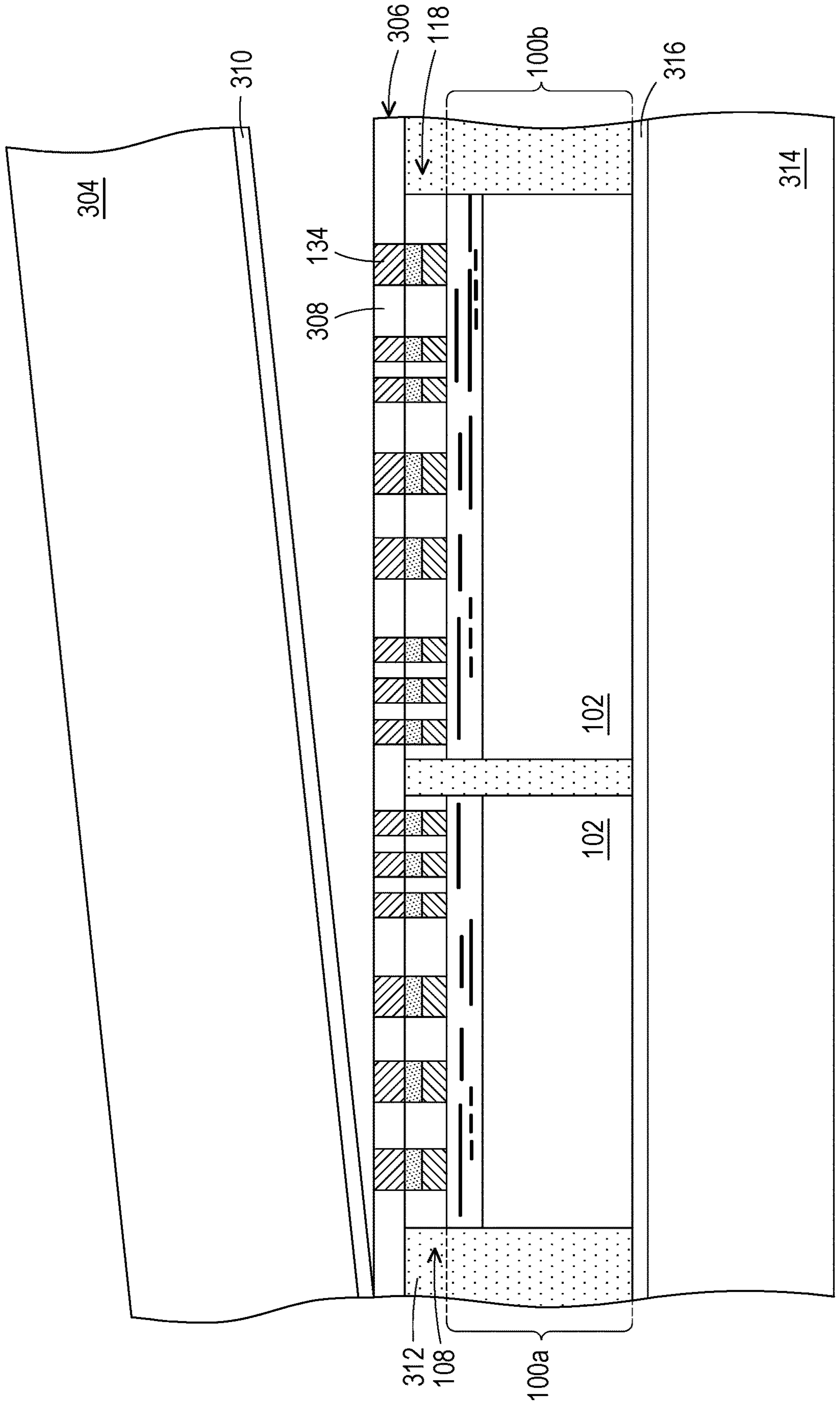

Referring to FIG. 2 and FIG. 3E, at a step S208, the carrier substrate 304 is detached from the initial package bonding layer 306. Preliminarily, the structure shown in FIG. 3D may be flipped over, and attached to another carrier substrate 314 (e.g., a glass carrier substrate) by the encapsulated structure. In some embodiments, the carrier substrate 314 is in contact with the encapsulated structure through an adhesive layer 316, such as a LTHC coating layer. Subsequently, the carrier substrate 304 is removed. In those embodiments where the carrier substrate 304 is attached to the initial package bonding layer 306 through the adhesive layer 310, the adhesive layer 310 may be removed along with the carrier substrate 304. As removal of the adhesive layer 310 and the carrier substrate 304, a side of the initial package bonding layer 306 may be exposed.

Figure 3F:
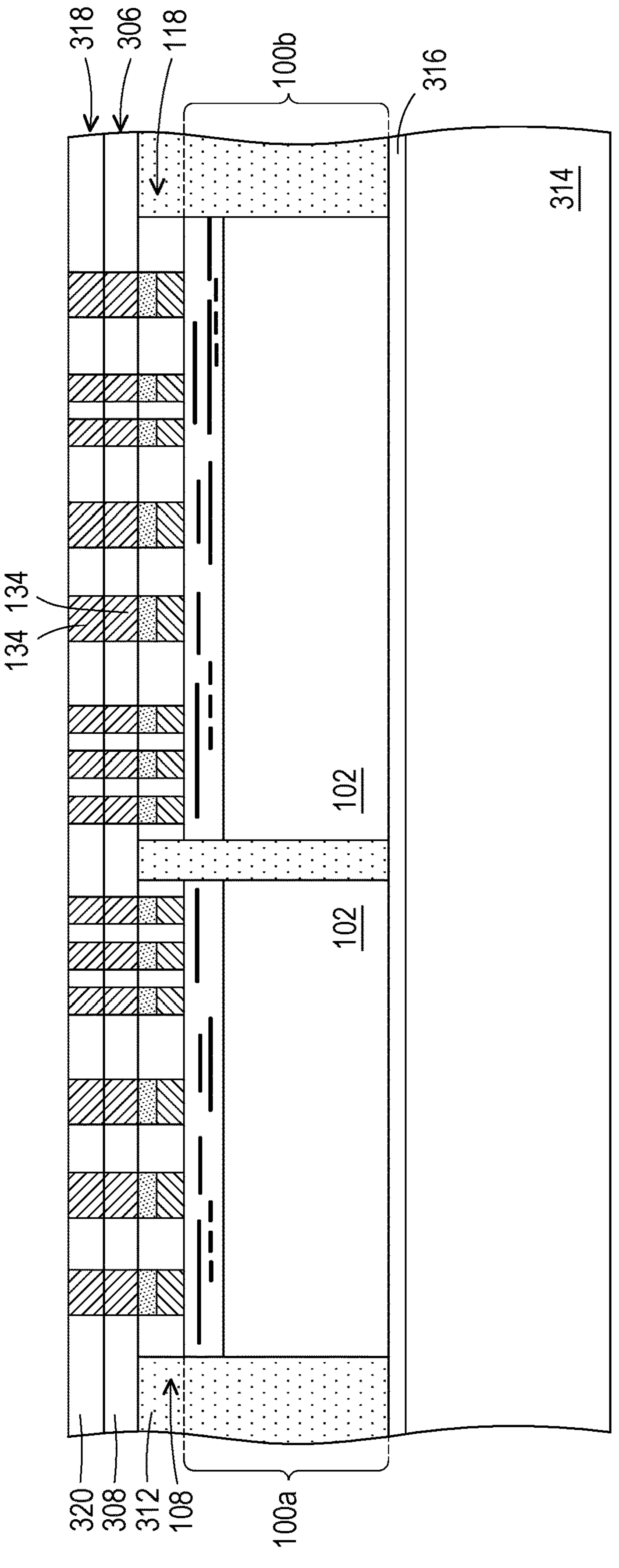

Referring to FIG. 2 and FIG. 3F, at a step S210, another initial package bonding layer 318 is formed. The initial package bonding layer 318 is stacked on the exposed side of the initial package bonding layer 306, and will be patterned to form the package bonding layer 130*a* as described with reference to FIG. 1. Specifically, the initial package bonding layer 318 includes the contact metals 134 of the package bonding layer 130*a*, and includes a polymer material layer 320 to be patterned to form the polymer layer 132 of the package bonding layer 130*a*. In addition, the contact metals 134 in the initial package bonding layer 318 are positioned in alignment with the contact metals 134 in the initial package bonding layer 306. By forming the initial package bonding layer 318, a bonding surface to be bonded with the bridge die 136 (and the passive die 156) in a following step can be provided by the latest formed initial package bonding layer 318, and thus is fresher and may be unoxidized. Therefore, the bridge die 136 (and the passive die 156) can be bonded with improved bonding strength. In some embodiments, before bonding of the bridge die 136 (and the passive die 156), a plasma or chemical treatment is further performed on the initial package bonding layer 318, to ensure a more promising bonding surface. Also, in some embodiments, a plasma or chemical treatment is performed on the initial package bonding layer 306 before formation of the initial package bonding layer 318. In these embodiments, contact resistance between the contact metals 134 in the initial package bonding layer 318 and the contact metals 134 in the initial package bonding layer 306 may be further reduced.

Figure 3G:
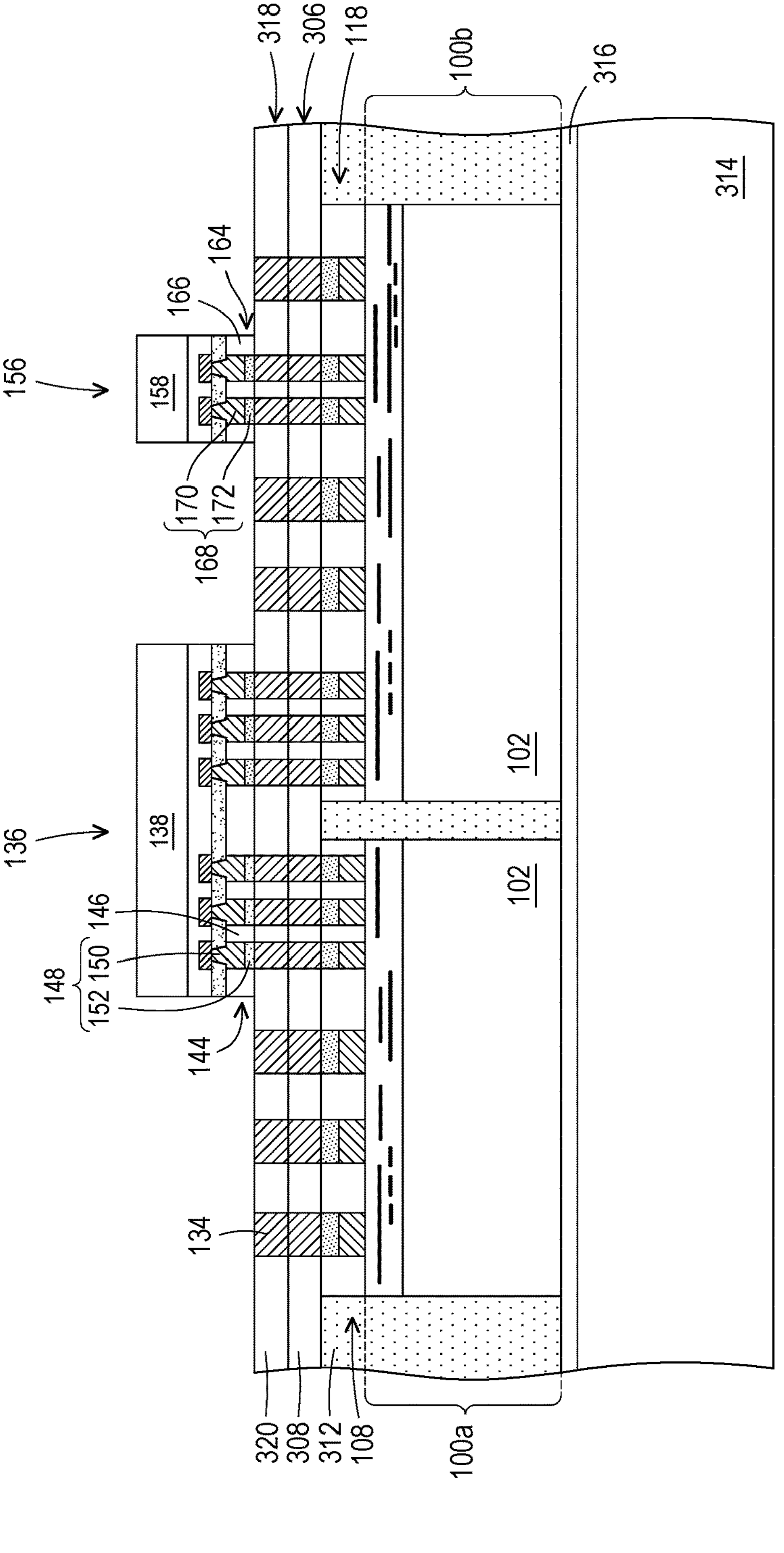

Referring to FIG. 2 and FIG. 3G, at a step S212, the bridge die 136 and the passive die 156 are bonded onto the initial package bonding layer 318. Preliminarily, the bridge die 136 formed with the die bonding layer 144 is picked and placed on the initial package bonding layer 318, such that the solder caps 152 of the die bonding layer 144 are in contact with some contact metals 134 of the initial package bonding layer 318, and the contact metals 150 as well as the solder caps 152 in the die bonding layer 144 are in alignment with these contact metals 134 in the initial package bonding layer 318. Similarly, the passive die 156 formed with the die bonding layer 164 is picked and placed aside the bridge die 136 on the initial package bonding layer 318, such that the solder caps 172 of the die bonding layer 164 are in contact with other contact metals 134 of the initial package bonding layer 318, and the contact metals 170 as well as the solder caps 172 in the die bonding layer 164 are in alignment with these contact metals 134 in the initial package bonding layer 318. Thereafter, a thermal treatment is performed. During the thermal treatment, the polymer layer 146 of the die bonding layer 144 covering the bridge die 136 and the polymer layer 166 of the die bonding layer 164 covering the passive die 156 are bonded to the polymer material layer 320 of the initial package bonding layer 318. Further, the contact metals 150 in the die bonding layer 144 are bonded to the overlapping contact metals 134 in the initial package bonding layer 318 through the solder caps 152 in between, and the contact metals 170 in the die bonding layer 164 are bonded to the overlapping contact metals 134 in the initial package bonding layer 318 through the solder caps 172 in between. As described, the initial package bonding layer 318 may be subjected to a plasma or chemical treatment before being attached to the bridge die 138 and the passive die 158. Since the solder caps 152, 172 are confined by the polymer layers 146, 166, further lateral protrusion of the solder caps 152, 172 at elevated temperature during the thermal treatment may be avoided. Therefore, unintended contact between adjacent ones of the solder caps 152, 172 can be effectively prevented.

In some embodiments, the semiconductor substrate 138 of the bridge die 136 and the semiconductor substrate 158 of the passive die 156 are further thinned after the bridge die 136 and the passive die 156 are bonded onto the initial package bonding layer 318. Further, in those embodiments where the passive die 158 is omitted, the hybrid bonding process (and the thinning process) may be performed only for the bridge die 136.

Figure 3H:
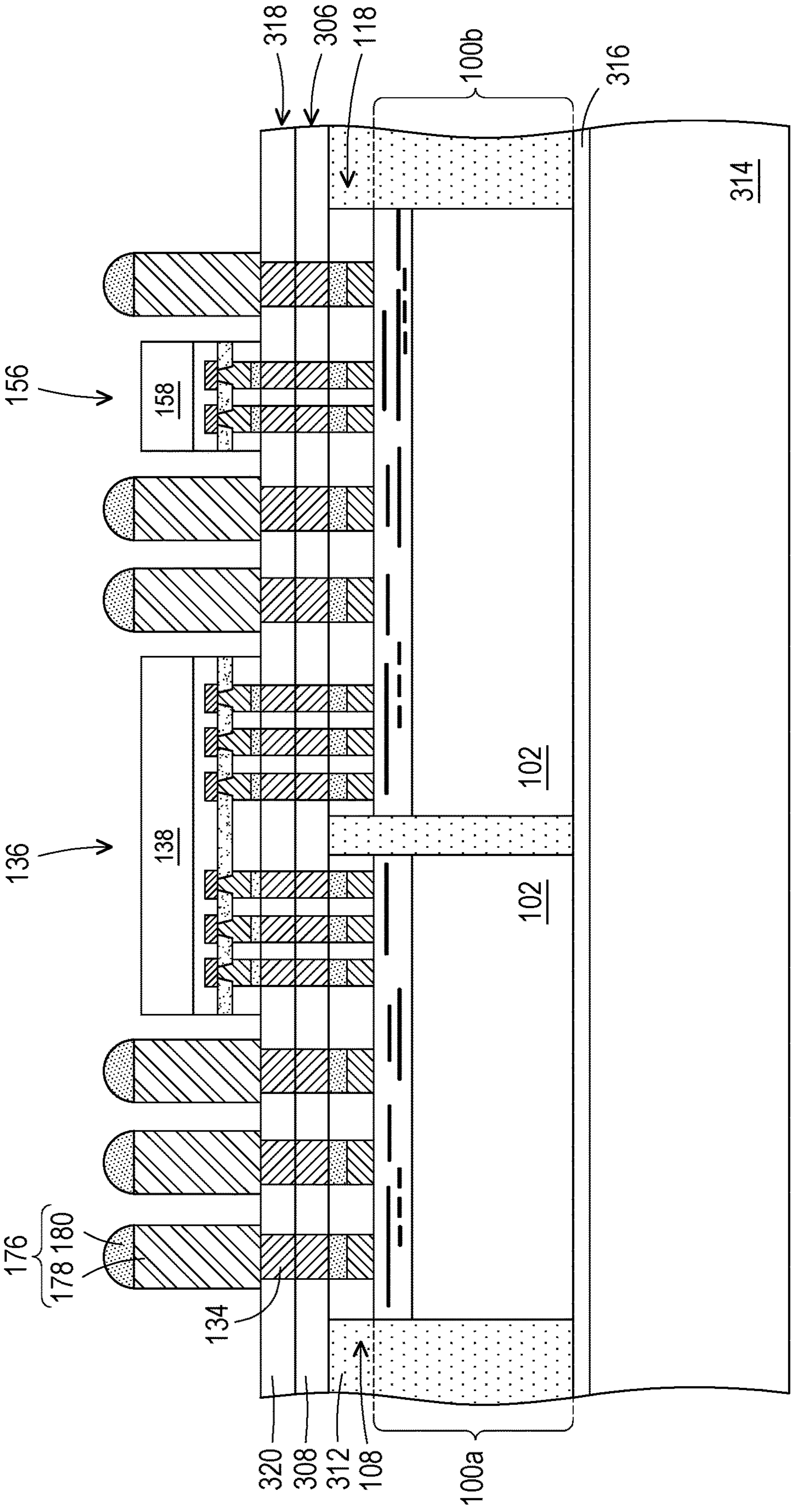

Referring to FIG. 2 and FIG. 3H, at a step S214, the electrical connectors 176 are formed on unoccupied ones of the contact metals 134 in the initial package bonding layer 318. Prior to formation of the electrical connectors 176, the bridge die 136 (and the passive die 156) may be covered by a mask pattern (not shown), and the mask pattern may be removed after formation of the electrical connectors 176.

Figure 3I:
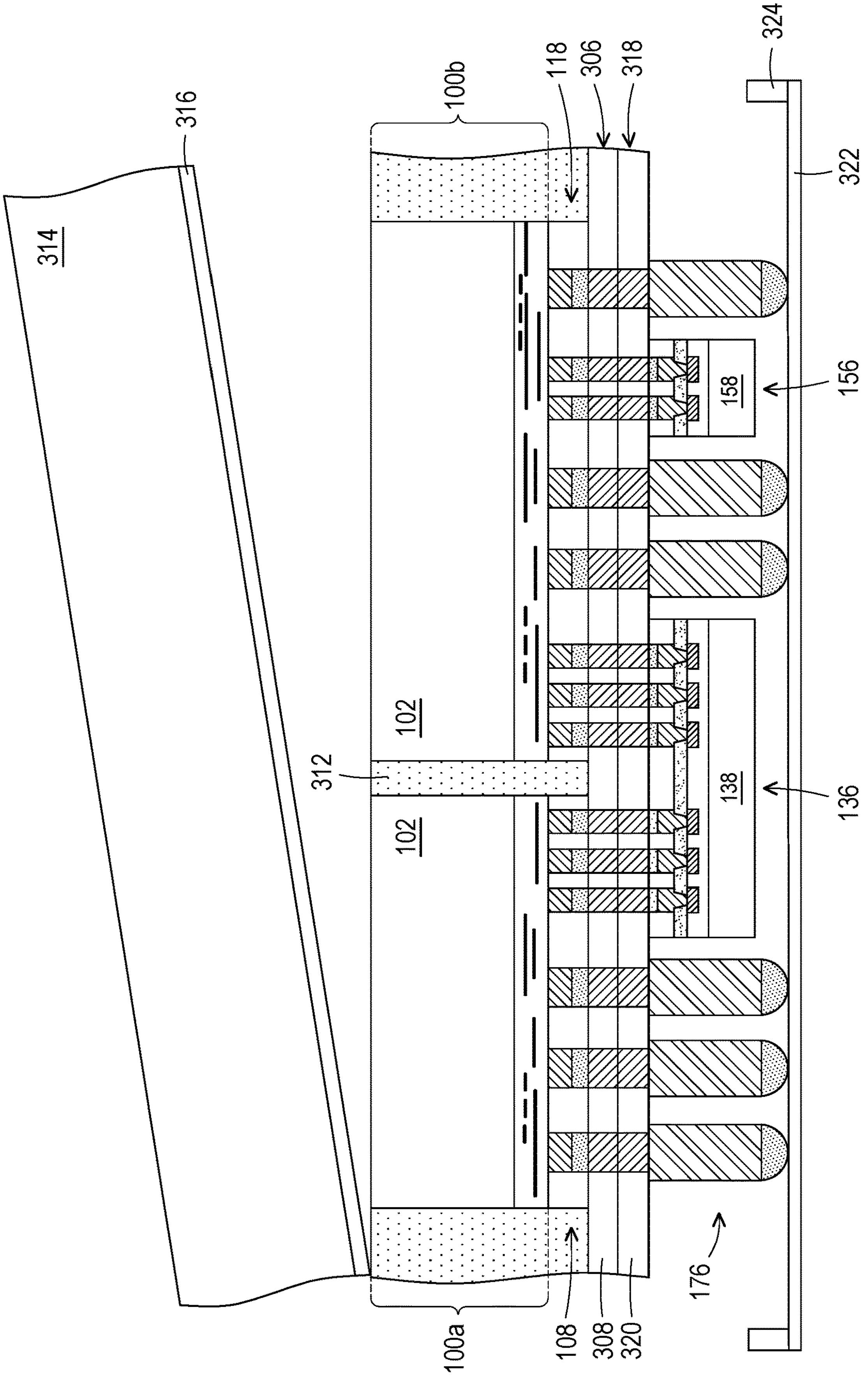

Referring to FIG. 2 and FIG. 3I, at a step S216, the carrier substrate 314 is detached from the encapsulated structure. Preliminarily, the structure shown in FIG. 3H may be flipped over, and attached to a tape 322 held by a frame 324. Subsequently, the carrier substrate 314 is removed. In those embodiments where the carrier substrate 314 is attached to the encapsulated structure through the adhesive layer 316, the adhesive layer 316 may be removed along with the carrier substrate 314. As removal of the adhesive layer 316 and the carrier substrate 314, a back side of the encapsulated structure may be exposed.

Figure 3J:
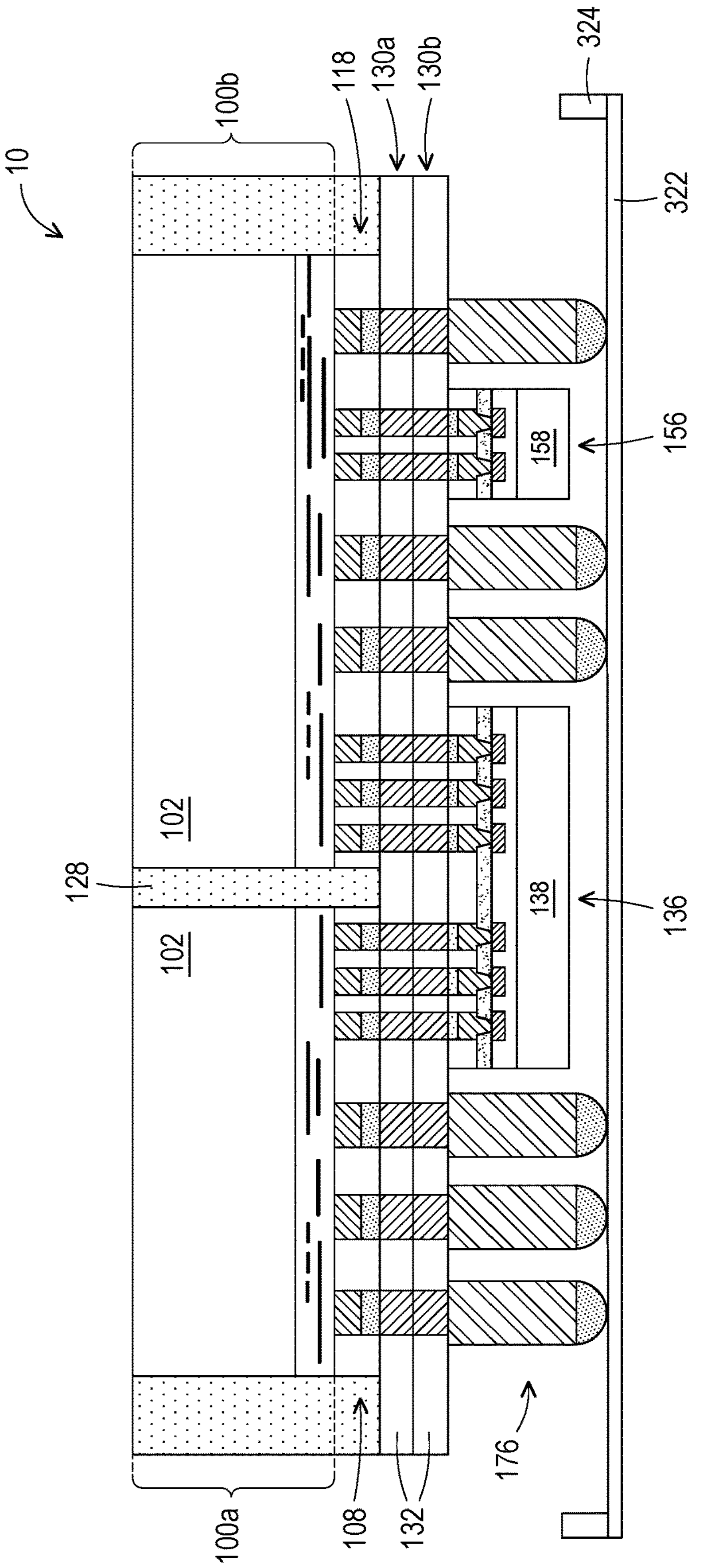

Referring to FIG. 2 and FIG. 3J, at a step S218, the current package structure is subjected to a singulation process. During the singulation process, the initial encapsulant 312 and the polymer material layers 308, 320 of the initial package bonding layers 306, 318 are cut through. As a result, the initial encapsulant 312 is patterned to be the encapsulant 128. In addition, the polymer material layers 308, 320 are patterned to be the polymer layers 132 with sidewalls substantially coplanar with sidewalls of the encapsulant 128, and the initial package bonding layers 306, 318 are turned into the package bonding layers 130*a*, 130*b*.

Up to here, the semiconductor package 10 is resulted on the supporting tape 322. As described, the initial package bonding layer 306 is formed at first, and the device dies 100*a*, 100*b* are bonded onto the initial package bonding layer 306 and are encapsulated in following steps. Therefore, the described process for forming the semiconductor package 10 may be referred to as a chip-last process.

Figure 4:
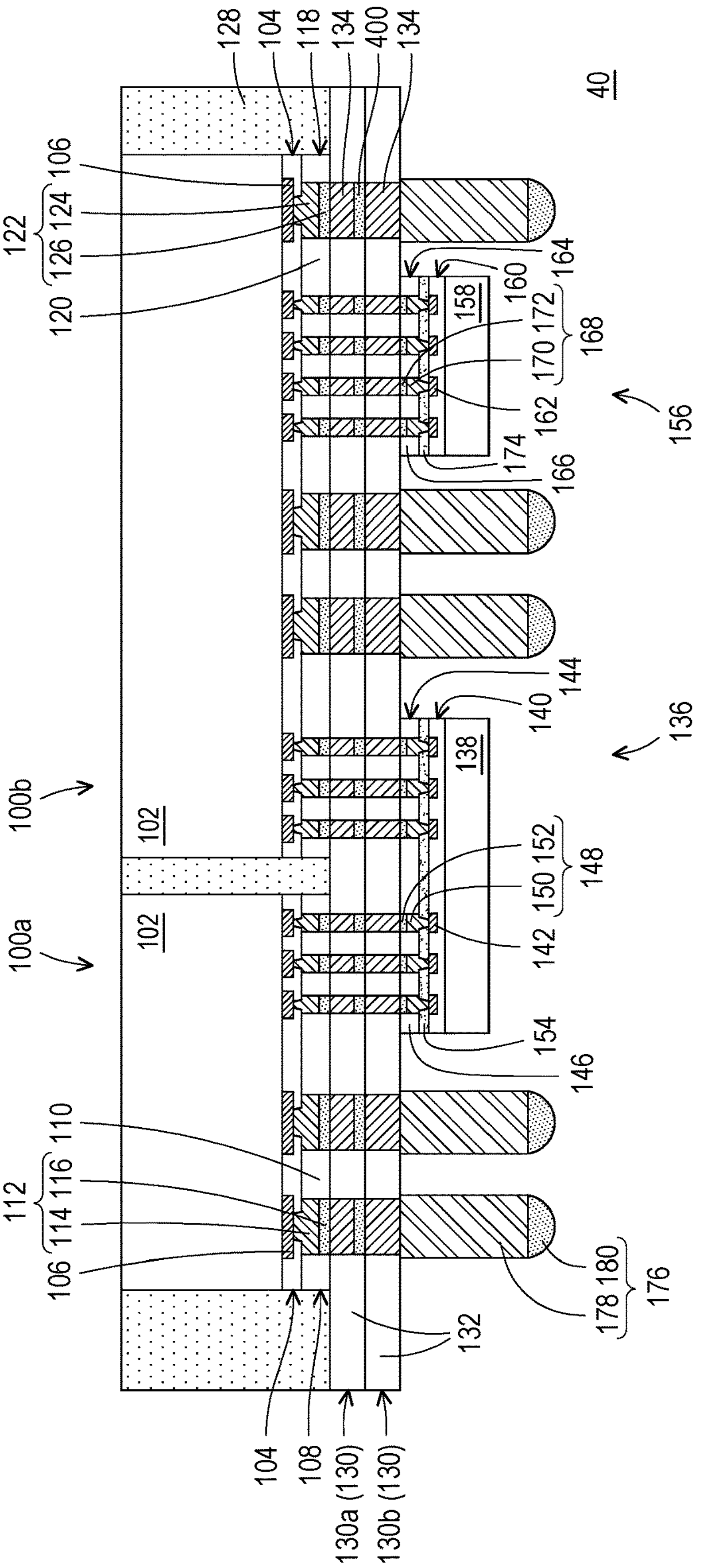
FIG. 4 is a schematic cross-sectional view illustrating a semiconductor package, according to some embodiments of the present disclosure.

FIG. 4 is a schematic cross-sectional view illustrating a semiconductor package 40, according to some embodiments of the present disclosure.

The semiconductor package 40 is similar to the semiconductor package 10 as described with reference to FIG. 1, except that solder caps 400 are further inserted between and in alignment with the contact metals 134 of the package die bonding layer 130*a* and the contact metals 134 of the package die bonding layer 130*b*. That is, in the semiconductor package 40, vertical conduction paths for routing the device dies 100*a*, 100*b* to the other side of the package bonding layers 130 further include the solder caps 400. As an option, the solder caps 400 are included in the package bonding layer 130*a*. In a manufacturing process similar to the chip-last process described with reference to FIG. 3A through FIG. 3J, the solder caps 400 may be formed on the contact metals 134 in openings extending through the polymer material layer 308 of the initial package bonding layer 306 at the step S202 shown in FIG. 3B. Since the solder caps 400 are confined by the polymer layer 132, lateral protrusion of the solder caps 400 at an elevated temperature during manufacturing can be effectively prevented. Therefore, the solder caps 400 can be properly isolated from one another, particularly for those formed with a relatively short pitch.

Figure 5:
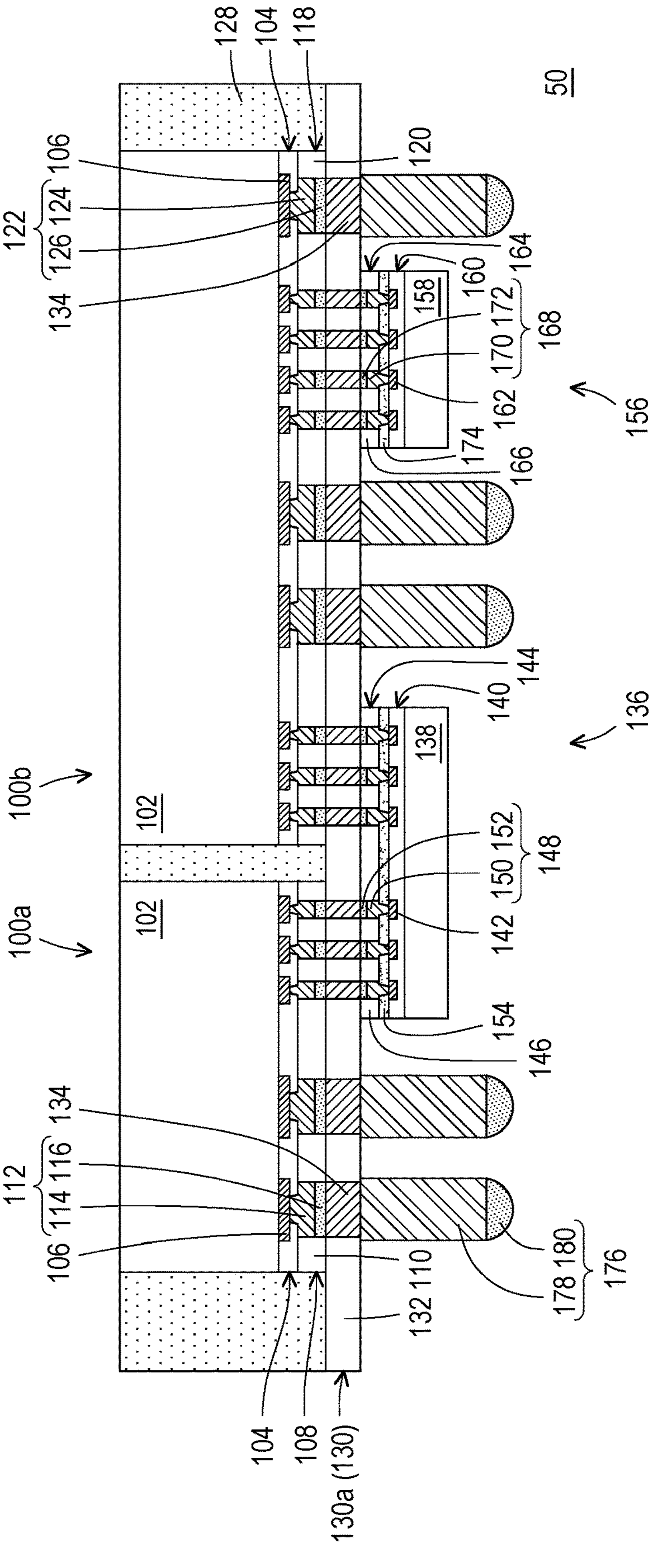
FIG. 5 is a schematic cross-sectional view illustrating a semiconductor package, according to some embodiments of the present disclosure.

FIG. 5 is a schematic cross-sectional view illustrating a semiconductor package 50, according to some embodiments of the present disclosure.

The semiconductor package 50 is similar to the semiconductor package 10 as described with reference to FIG. 1, except that the package bonding layer 130*b* is absent in the semiconductor package 50. That is, in the semiconductor package 50, the die bonding layer 144 covering the bridge die 136 (and the bonding layer 164 covering the passive die 156) is/are bonded to the package bonding layer 130*a* without another package bonding layer in between, and the electrical connectors 176 are not separated from the contact metals 134 in the package bonding layer 130*a* by another layer of contact metals.

A process for manufacturing the semiconductor package 50 is similar to the chip-last process described with reference to FIG. 3A through FIG. 3J, except that the step S210 shown in FIG. 3F is omitted and the package bonding layer 130*a* takes the place of the package bonding layer 130*b* for engaging with the die bonding layer 144 covering the bridge die 136, the electrical connectors 176 (and the die bonding layer 164 covering the passive die 156) in the steps S212, S214 shown in FIG. 3G and FIG. 3H.

Figure 6:
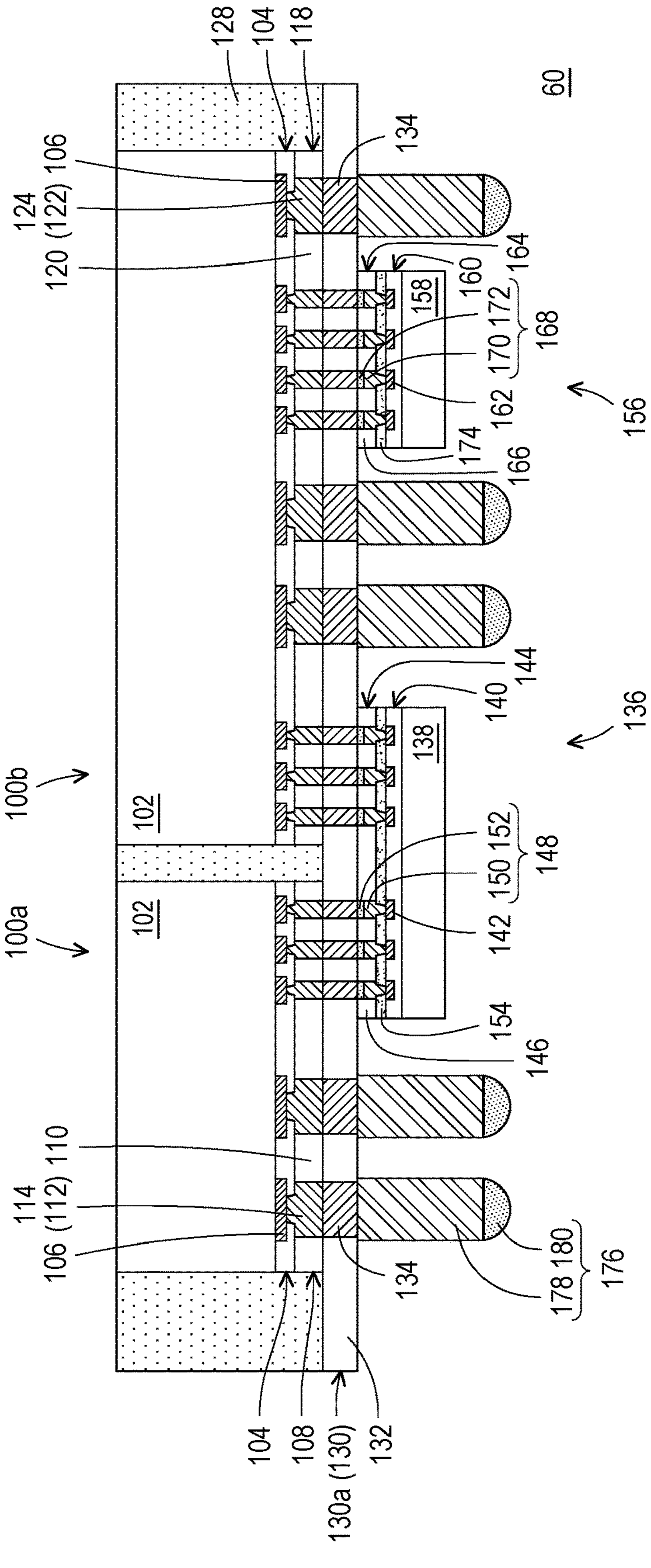
FIG. 6 is a schematic cross-sectional view illustrating a semiconductor package, according to some embodiments of the present disclosure.

FIG. 6 is a schematic cross-sectional view illustrating a semiconductor package 60, according to some embodiments of the present disclosure.

The semiconductor package 60 is similar to the semiconductor package 50 described with reference to FIG. 5, except that the solder caps 116, 126 are removed from the die bonding layers 108, 118. Accordingly, in the semiconductor package 60, the contact metals 114, 124 in the die bonding layers 108, 118 are directly in contact with the contact metals 134 in the package bonding layer 130*a*.

Figure 7:
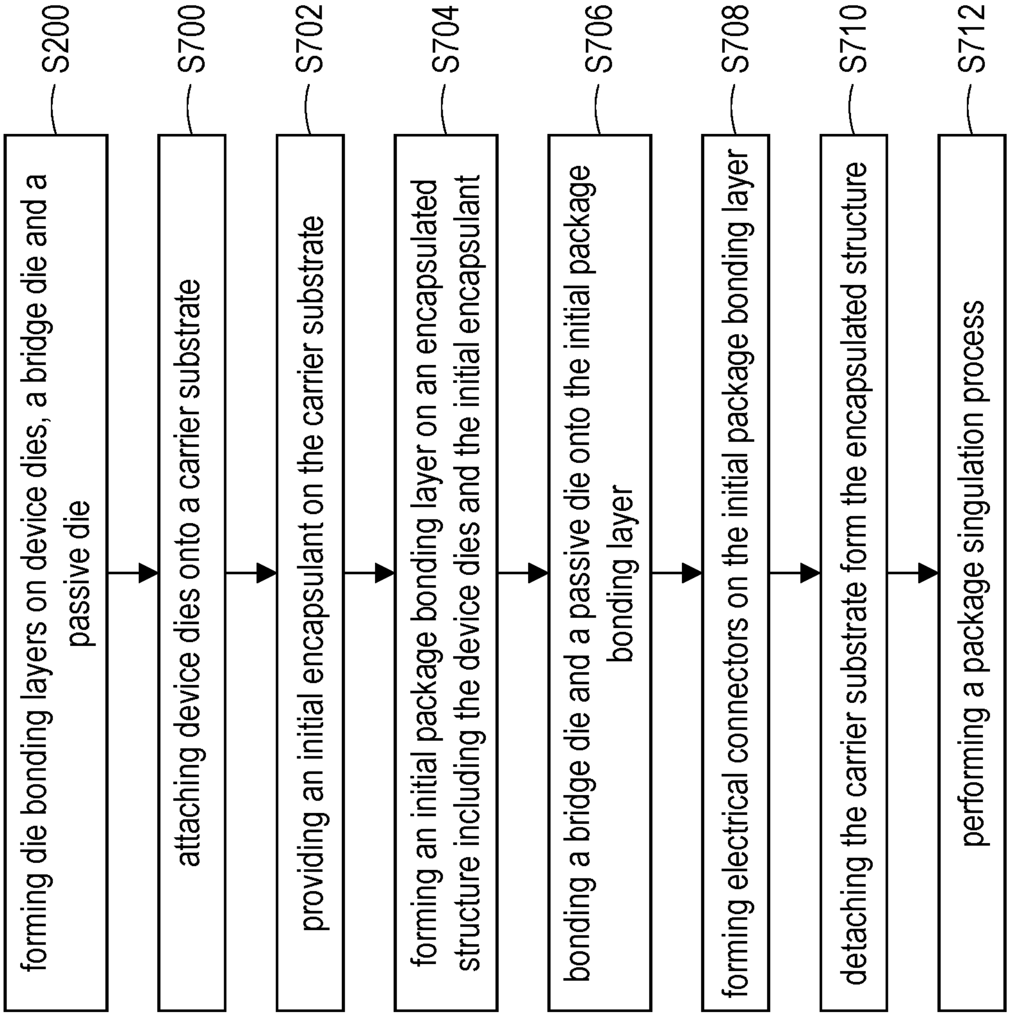
FIG. 7 is a flow diagram illustrating a method for manufacturing the semiconductor package shown in FIG. 6, according to the alternative embodiments of the present disclosure.

FIG. 7 is a flow diagram illustrating a method for manufacturing the semiconductor package 60, according to the alternative embodiments of the present disclosure. FIG. 8A through FIG. 8F are schematic cross-sectional views illustrating intermediate structures at various stages during the process illustrated in FIG. 7.

Referring to FIG. 7, the process begins with the step S200, which is described with reference to FIG. 3A. Subsequently, at a step S700 shown in FIG. 8A, the device dies 100*a*, 100*b* are attached onto a carrier substrate 800. To be more specific, the device die 100*a* is attached to the carrier substrate 800 by a back side, which is opposite to an active side covered with the die bonding layer 108. Similarly, the device die 100*b* is also attached to the carrier substrate 800 by a back side opposite to an active side covered by the die bonding layer 118. As an example, the carrier substrate 800 may be a glass carrier substrate. According to some embodiments, the device dies 100*a*, 100*b* are respectively attached to the carrier substrate 800 via a die attach film 802.

Figure 8A:
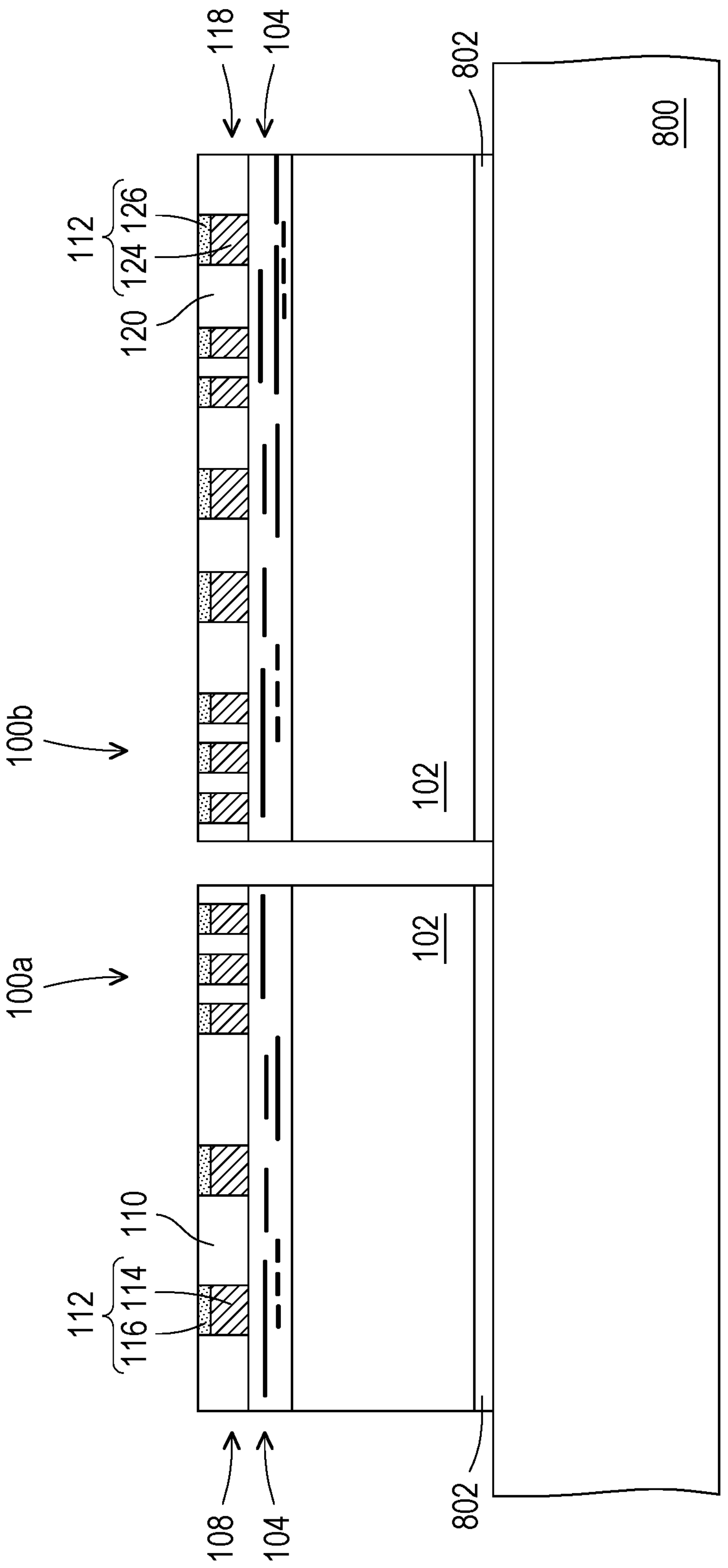
FIG. 8A through FIG. 8F are schematic cross-sectional views illustrating intermediate structures at various stages during the process illustrated in FIG. 7.
Figure 8B:
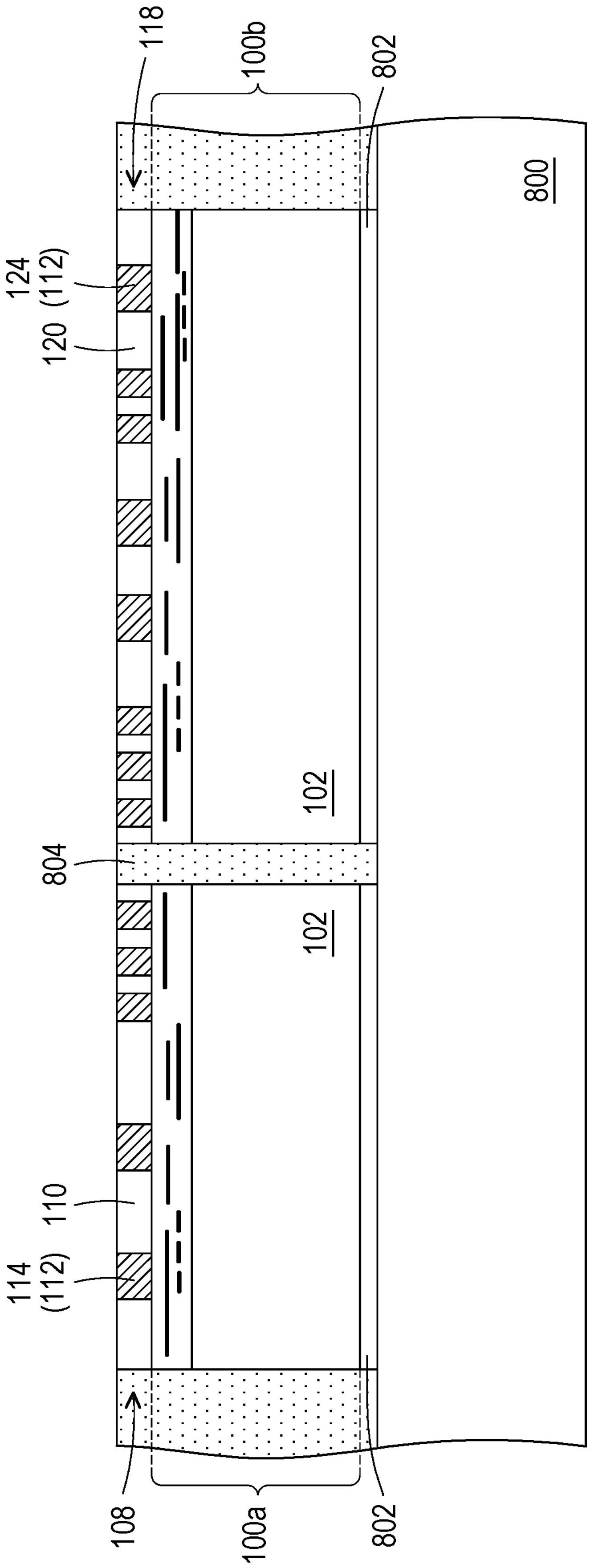

Referring to FIG. 7 and FIG. 8B, at a step S702, an initial encapsulant 804 is provided on the carrier substrate 800. As a result, the device die 100*a* (along with the die bonding layer 108 and the die attach film 802 at opposite sides) and the device die 100*b* (along with the die bonding layer 118 and the die attach film 802 at opposite sides) are laterally encapsulated by the initial encapsulant 804. According to some embodiments, a planarization process is further performed to expose the contact metals 114, 124 of the contact features 112, 122 in the die bonding layers 108, 118. As a result, the solder caps 116, 126 of the contact features 112, 122 are removed, and the polymer layers 110, 120 of the die bonding layers 108, 118 as well as the initial encapsulant 804 are thinned. In a subsequent step, the initial encapsulant 804 will be patterned to form the encapsulant 128 during a package singulation process.

Figure 8C:
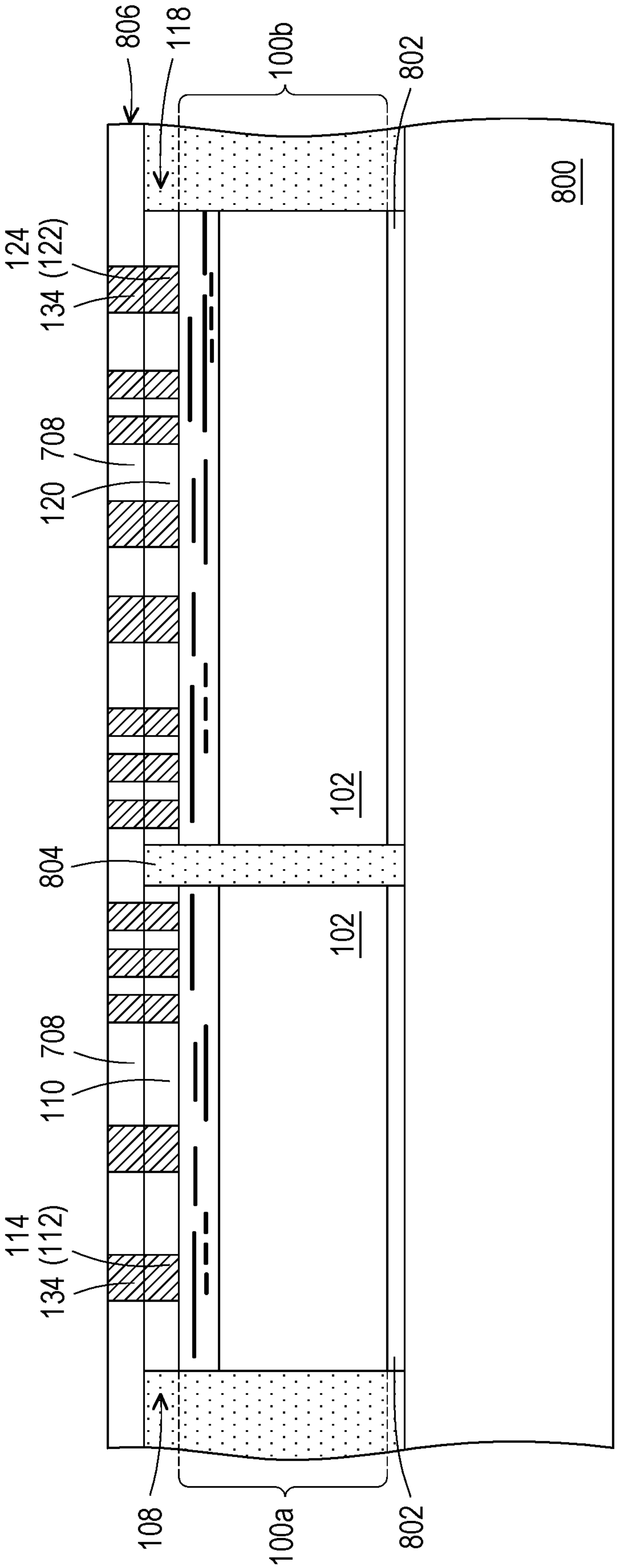

Referring to FIG. 7 and FIG. 8C, at a step S704, an initial package bonding layer 806 is formed on the initial encapsulant 804 and the die bonding layers 108, 118. As a result, an encapsulated structure including the device die 100*a* (along with the die bonding layer 108 and the die attach film 802 at opposite sides), the device die 100*b* (along with the die bonding layer 118 and the die attach film 802 at opposite sides) and the initial encapsulant 804 is covered by the initial package bonding layer 806. The initial package bonding layer 806 will be patterned to form the package bonding layer 130*a*. To be more specific, the initial package bonding layer 806 includes the contact metals 134 of the package bonding layer 130*a*, and includes a polymer material layer 808 to be patterned to form the polymer layer 132 of the package bonding layer 130*a*. In addition, the contact metals 134 in the initial package bonding layer 806 are positioned in alignment with the contact metals 114, 124 in the die bonding layers 108, 118, thus are stacked on and in contact with the contact metals 114, 124.

Figure 8D:
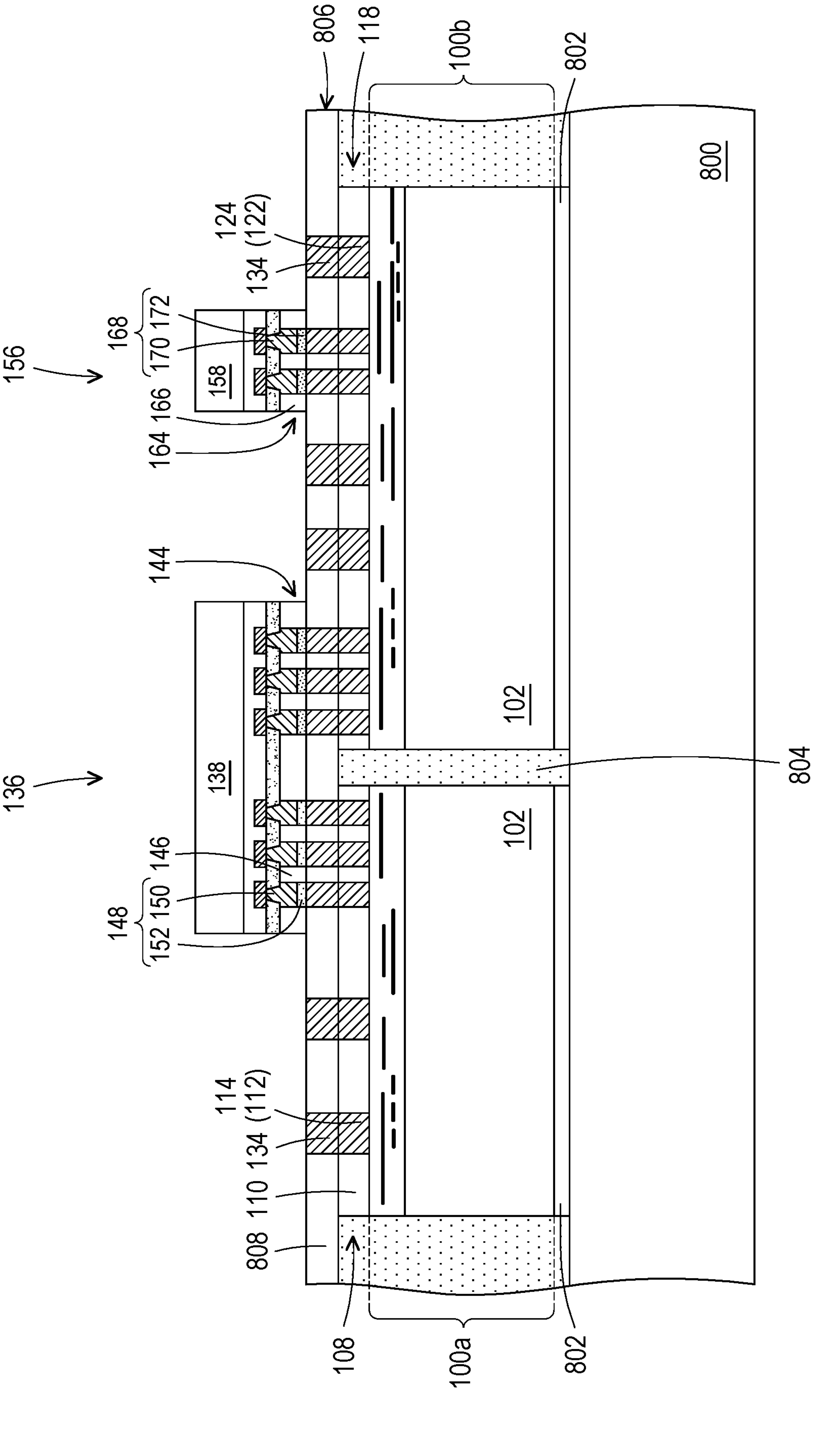

Referring to FIG. 7 and FIG. 8D, at a step S706, the bridge die 136 and the passive die 156 are bonded onto the initial package bonding layer 806. This step is similar to the step S212 described with reference to FIG. 3G, except that the initial package bonding layer 806 takes the place of the initial package bonding layer 318 for receipting the bridge die 136 and the passive die 156. For simplicity, details of this step are not repeated again.

Figure 8E:
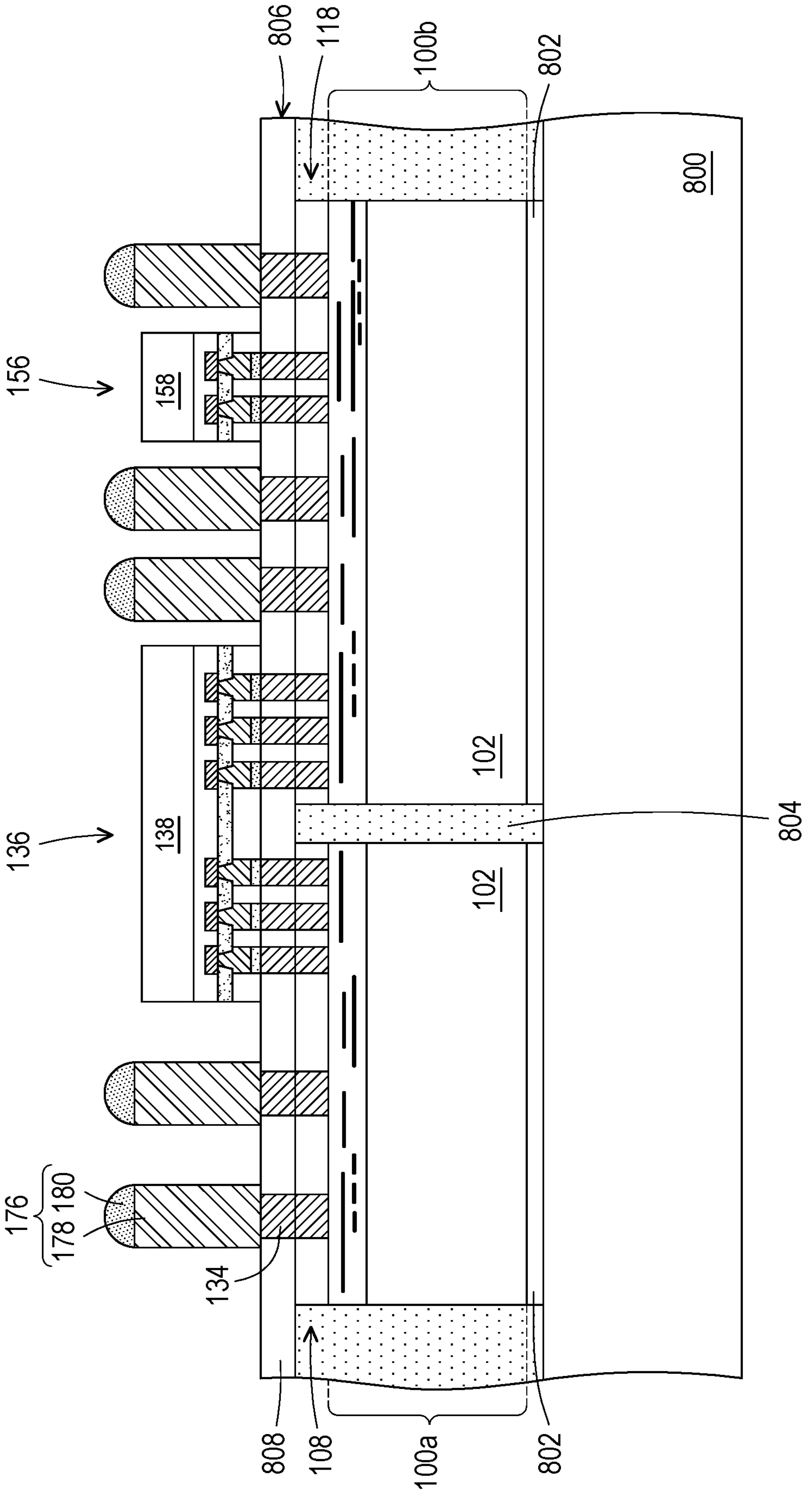

Referring to FIG. 7 and FIG. 8E, at a step S708, the electrical connectors 176 are formed on unoccupied ones of the contact metals 134 in the initial package bonding layer 806. Prior to formation of the electrical connectors 176, the bridge die 136 (and the passive die 156) may be covered by a mask pattern (not shown), and the mask pattern may be removed after formation of the electrical connectors 176.

Figure 8F:
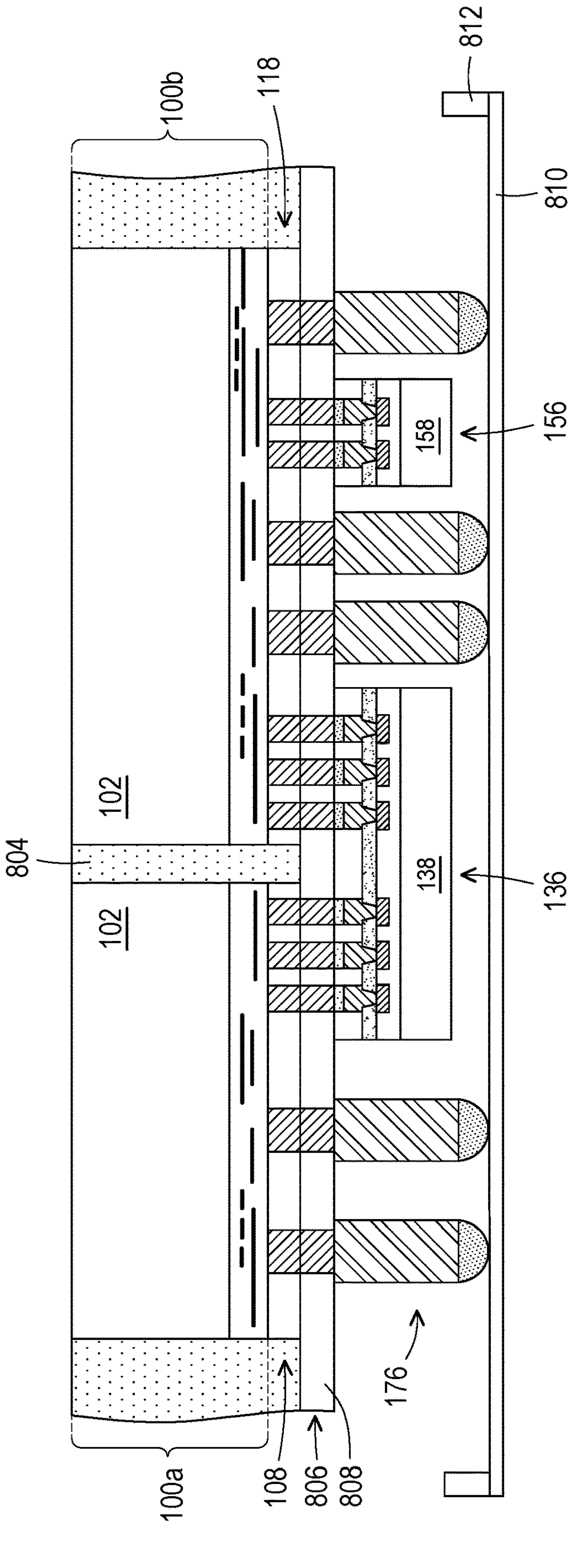

Referring to FIG. 7 and FIG. 8F, at a step S710, the carrier substrate 800 is detached from the encapsulated structure. Preliminarily, the structure shown in FIG. 8E may be flipped over, and attached to a tape 810 held by a frame 812. Subsequently, the carrier substrate 800 is removed. In some embodiments, after the carrier substrate 800 is removed, the die attach films 802 are removed, and the initial encapsulant 804 is planarized to be substantially coplanar with back sides of the device dies 100*a*, 100*b*.

Afterwards, at a step S712, the current package structure is subjected to a singulation process. During the singulation process, the initial encapsulant 804 and the polymer material layer 808 of the initial package bonding layer 806 are cut through. As a result, the initial encapsulant 804 is patterned to be the encapsulant 128. In addition, the polymer material layer 808 is patterned to be the polymer layer 132 with sidewalls substantially coplanar with sidewalls of the encapsulant 128, and the initial package bonding layer 806 is turned into the package bonding layer 130*a*.

Up to here, the semiconductor package 60 is resulted on the supporting tape 810. As described, the device dies 100*a*, 100*b* are encapsulated at first, and the initial package bonding layer 806 is formed on the encapsulated structure in a following step. Therefore, the described process for forming the semiconductor package 60 may be referred to as a chip-first process.

Figure 9:
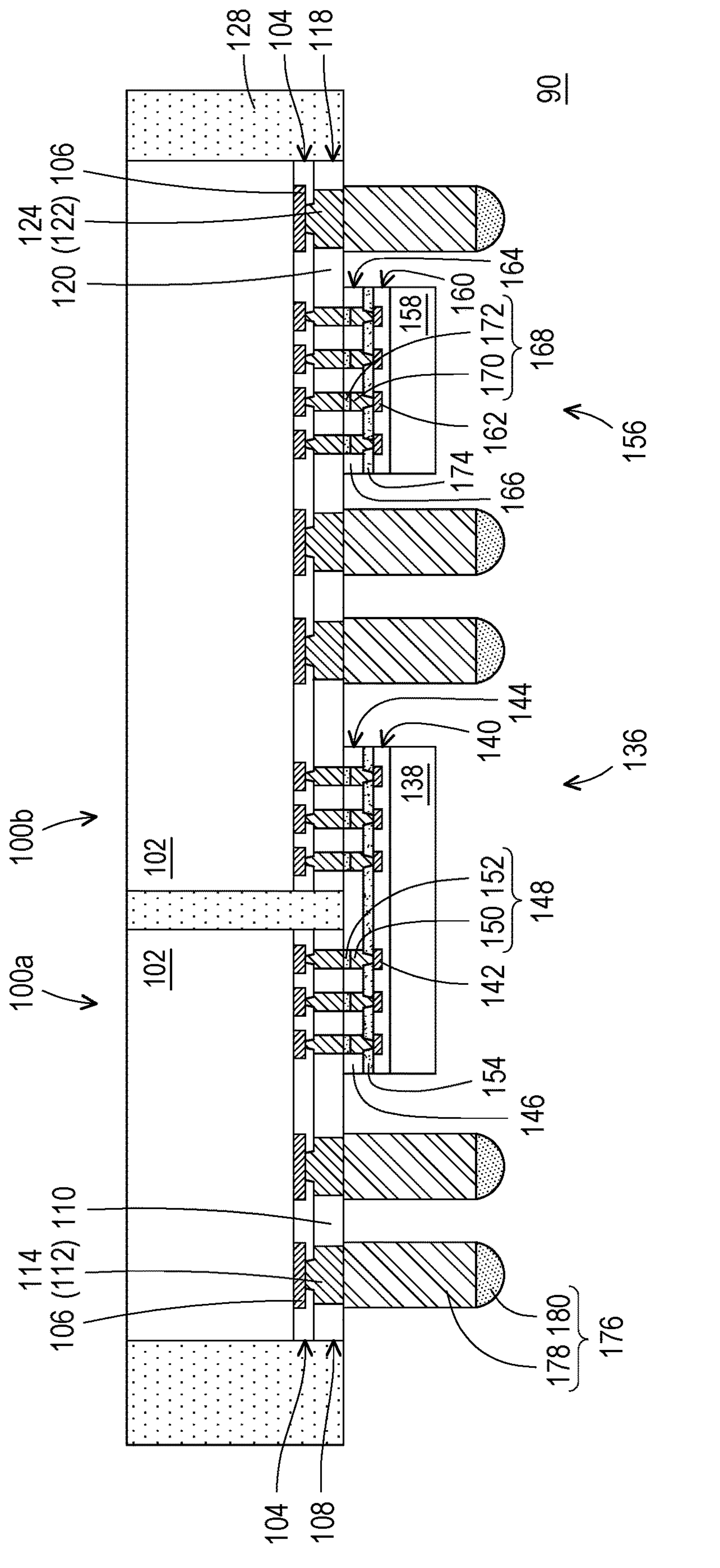
FIG. 9 is a schematic cross-sectional view illustrating a semiconductor package, according to some embodiments of the present disclosure.

FIG. 9 is a schematic cross-sectional view illustrating a semiconductor package 90, according to some embodiments of the present disclosure.

The semiconductor package 90 is similar to the semiconductor package 60 described with reference to FIG. 6, except that the package bonding layer 130*a* is absent in the semiconductor package 90. That is, the semiconductor package 90 does not include any of the described package bonding layers 130*a*, 130*b*. Accordingly, in the semiconductor package 90, the die bonding layers 108, 118 covering the device dies 100*a*, 100*b* are directly bonded with the bonding layer 144 covering the bridge die 136 (and the bonding layer 164 covering the passive die 156). In addition, the electrical connectors 176 may be directly formed on the contact metals 114, 124 of the die bonding layers 108, 118.

A process for manufacturing the semiconductor package 90 is similar to the chip-first process described with reference to FIG. 8A through FIG. 8F, except that the step S704 shown in FIG. 8C is omitted and the die bonding layers 108, 118 takes the place of the package bonding layer 130*a* for engaging with the die bonding layer 144 covering the bridge die 136, the electrical connectors 176 (and the die bonding layer 164 covering the passive die 156) in the steps S706, S708 shown in FIG. 8D and FIG. 8E.

As above, a semiconductor package and a manufacturing method thereof are provided. The semiconductor package includes device dies and an encapsulant laterally encapsulating the device dies. In addition, the device dies are routed to external components through vertical conduction paths formed in bonding layers lying between the device dies and the external components, and at least two of these bonding layers are bonded with each other via dielectric-to-dielectric bonding and metal-to-metal bonding. For instance, the external components may include a bridge die for establishing communication between the device dies. As compared to a redistribution layer including fine patterns for providing both lateral and vertical conduction paths, the bonding layers utilized in embodiments of the present disclosure may only include the vertical conduction paths, and can be formed with much less complexity. Moreover, the bonding layers include polymer layers laterally surrounding the vertical conduction paths formed therein. Therefore, solder caps included in the vertical conduction paths for improving metal-to-metal adhesion can be confined by the polymer layers, from lateral protrusion while being heated during manufacturing. Consequently, unintended contact between adjacent vertical conduction paths (particularly the ones separated by a rather short spacing) in the bonding layers can be effectively avoided.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In an aspect of the present disclosure, a semiconductor package is provided. The semiconductor package comprises: a first device die and a second device die; an encapsulant, laterally encapsulating the first and second device dies; a bridge die, electrically connected to the first and second device dies and establishing communication between the first and second device dies; and bonding layers, between the first and second device dies and the bridge die, and comprising a first die bonding layer and a second die bonding layer respectively disposed upon the first device die and the second device die, and a third die bonding layer disposed upon the bridge die, wherein each of the bonding layers comprises a polymer layer and metallic features embedded in the polymer layer.

In another aspect of the present disclosure, a semiconductor package is provided. The semiconductor package comprises: device dies having first die bonding layers respectively covering active sides of the device dies; an encapsulant, laterally surrounding and in lateral contact with the device dies and the first die bonding layers; a first package bonding layer, covering the encapsulant and the first die bonding layers; a bridge die, electrically communicating the device dies; electrical connectors, separated from the first die bonding layers via the first package bonding layer; and a second die bonding layer, between the bridge die and the first package bonding layer, wherein each layer of the first die bonding layers, the first package bonding layer and the second die bonding layer comprises a polymer layer and metallic features embedded in the polymer layer.

In yet another aspect of the present disclosure, a method for manufacturing a semiconductor package is provided. The method comprises: forming first die bonding layers on device dies, respectively; forming a second die bonding layer on a bridge die; providing a package bonding layer; laterally encapsulating the device dies and the first die bonding layers by an encapsulant; and bonding the second die bonding layer to the package bonding layer, such that the device dies are electrically connected to the bridge die via conduction paths extending through polymer layers of the first die bonding layers, the package bonding layer and the second die bonding layer, and the polymer layer of second die bonding layer is bonded to the polymer layer of the package bonding layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:

a first device die and a second device die;

an encapsulant, laterally encapsulating the first and second device dies;

a bridge die, electrically connected to the first and second device dies and establishing communication between the first and second device dies; and bonding layers, between the first and second device dies and the bridge die, and comprising a first die bonding layer and a second die bonding layer respectively disposed upon the first device die and the second device die, and a third die bonding layer disposed upon the bridge die, wherein each of the bonding layers comprises a polymer layer, and contact metals and solder caps embedded in the polymer layer, and wherein the contact metal and the solder caps are laterally surrounded by the polymer layer in the first die bonding layer and the second die bonding layer.

2. The semiconductor package according to claim 1, wherein the contact metals and the solder caps in the bonding layers are arranged to form vertical conduction paths, and the first and second device dies are electrically connected to the bridge die by a first group of the vertical conduction paths.

3. The semiconductor package according to claim 2, further comprising:

electrical connectors and a passive die, connected to the first and second device dies via a second group of the vertical conduction paths.

4. The semiconductor package according to claim 3, wherein the first and second groups of the vertical conduction paths are distributed within regions overlapped with the device dies.

5. The semiconductor package according to claim 3, wherein a height of the electrical connectors is greater than a height of the bridge die, and greater than a height of the passive die.

6. The semiconductor package according to claim 1, wherein the third die bonding layer is in direct contact with the first and second die bonding layers via polymer bonding and metallic bonding.

7. The semiconductor package according to claim 1, wherein the bonding layers further comprise:

a package bonding layer, separating the first and second die bonding layers from the third die bonding layer, wherein a top surface of the encapsulant is entirely covered by the package bonding layer, and the top surface of the encapsulant is coplanar with the surface of the surface of the solder caps and the top surface of the polymer layer.

8. The semiconductor package according to claim 7, wherein the third die bonding layer is in direct contact with the package bonding layer via polymer bonding and metallic bonding.

9. The semiconductor package according to claim 8, wherein the first and second die bonding layers are in direct contact with the package bonding layer via polymer bonding and metallic bonding.

10. A semiconductor package, comprising:

device dies having first die bonding layers respectively covering active sides of the device dies, wherein the first die bonding layers comprises first polymer layers, and first metallic features and second metallic features embedded in the first polymer layers, and wherein the second metallic features have a greater lateral dimension than the first metallic features;

an encapsulant, laterally surrounding and in lateral contact with the device dies and the first die bonding layers;

a first package bonding layer, covering the encapsulant and the first die bonding layers, wherein the first package bonding layer comprises a second polymer layer, and third metallic features and fourth metallic features embedded in the second polymer layer, and wherein a pitch and a pattern width of the third metallic features and the fourth metallic features of the first package bonding layer substantially corresponds to a pitch and a pattern width of the first metallic features and the second metallic features of the first die bonding layers;

a bridge die, electrically communicating the device dies through the first metallic features and the third metallic features;

electrical connectors, separated from the first die bonding layers via the first package bonding layer and electrically connected to the device dies through the second metallic features and the fourth metallic features; and a second die bonding layer, between the bridge die and the first package bonding layer.

11. The semiconductor package according to claim 10, wherein the bridge die is electrically connected to the device dies via first vertical conduction paths including the first metallic features in the first die bonding layers, the third metallic features in the first package bonding layer, and metallic features in the second die bonding layer, and the electrical connectors are electrically connected to the device dies via second vertical conduction paths including the second metallic features in the first die bonding layers and the fourth metallic features in the first package bonding layer.

12. The semiconductor package according to claim 11, wherein the first vertical conduction paths each having a first width are arranged with a first pitch, the second vertical conduction paths each having a second width are arranged with a second pitch, the first width is shorter than the second width, and the first pitch is smaller than the second pitch.

13. The semiconductor package according to claim 12, wherein the first vertical conduction paths are longer than the second vertical conduction paths.

14. The semiconductor package according to claim 11, further comprising:

a second package bonding layer, lying between the first package bonding layer and the first die bonding layer, and comprising a third polymer layer, and fifth metallic features and sixth metallic features embedded in the third polymer layer, wherein the first vertical conduction paths further comprise the fifth metallic features of the second package bonding layer, and the second vertical conduction paths further comprise the sixth metallic features of the second package bonding layer.

15. The semiconductor package according to claim 14, wherein the first polymer layers of the first die bonding layers are directly bonded with the third polymer layer of the second package bonding layer.

16. A method for manufacturing a semiconductor package, comprising:

forming first die bonding layers on device dies, respectively;

forming a second die bonding layer on a bridge die;

providing a first package bonding layer on a carrier substrate;

bonding the first die bonding layers to the first package bonding layer;

after bonding the first die bonding layers to the first package bonding layer, laterally encapsulating the device dies and the first die bonding layers by an encapsulant;

after forming the encapsulant and detaching the carrier substrate, providing a second package bonding layer on the first package bonding layer; and bonding the second die bonding layer to the second package bonding layer, such that the device dies are electrically connected to the bridge die via conduction paths extending through polymer layers of the first die bonding layers, the first package bonding layer, the second package bonding layer, and the second die bonding layer, and the polymer layer of second die bonding layer is bonded to the polymer layer of the second package bonding layer.

17. The method for manufacturing the semiconductor package according to claim 16, wherein the polymer layers of the first die bonding layers are bonded to the polymer layer of the first package bonding layer.

18. The method for manufacturing the semiconductor package according to claim 17, wherein the second package bonding layer is provided on the first package bonding layer after laterally encapsulating the device die and the first die bonding layers with the encapsulant, after detaching the carrier substrate, and after attaching the encapsulant onto another carrier substrate.

19. The method for manufacturing the semiconductor package according to claim 16, wherein the first package bonding layer and the second package bonding layer are provided on the encapsulant and the first die bonding layers.

20. The method for manufacturing the semiconductor package according to claim 16, further comprising:

performing a singulation process to cut through the polymer layers of the first package bonding layer and the second package bonding layer, and the encapsulant.

* * * * *